United States Patent
Matsuno

(10) Patent No.: US 9,437,599 B2
(45) Date of Patent: Sep. 6, 2016

(54) NONVOLATILE SEMICONDUCTOR MEMORY DEVICE AND METHOD OF MANUFACTURING THE SAME

(71) Applicant: Kabushiki Kaisha Toshiba, Minato-Ku (JP)

(72) Inventor: Koichi Matsuno, Mie (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/635,287

(22) Filed: Mar. 2, 2015

(65) Prior Publication Data

US 2016/0049414 A1 Feb. 18, 2016

Related U.S. Application Data

(60) Provisional application No. 62/036,423, filed on Aug. 12, 2014.

(51) Int. Cl.

| | |
|---|---|
| *H01L 29/788* | (2006.01) |
| *H01L 27/115* | (2006.01) |
| *H01L 29/66* | (2006.01) |
| *H01L 29/49* | (2006.01) |

(Continued)

(52) U.S. Cl.
CPC ..... *H01L 27/11521* (2013.01); *H01L 21/0217* (2013.01); *H01L 21/02068* (2013.01); *H01L 21/28273* (2013.01); *H01L 27/11524* (2013.01); *H01L 29/495* (2013.01); *H01L 29/511* (2013.01); *H01L 29/515* (2013.01); *H01L 29/518* (2013.01); *H01L 29/66825* (2013.01); *H01L 29/788* (2013.01)

(58) Field of Classification Search
CPC ........... H01L 29/518; H01L 29/66825; H01L 29/511; H01L 29/495; H01L 29/788; H01L 21/28273; H01L 21/0217; H01L 21/02068; H01L 27/11521

See application file for complete search history.

(56) References Cited

U.S. PATENT DOCUMENTS

| | | | |
|---|---|---|---|
| 8,557,705 B2 | 10/2013 | Hizawa et al. | |
| 2009/0026527 A1* | 1/2009 | Ryusenji | H01L 27/115 257/316 |

(Continued)

FOREIGN PATENT DOCUMENTS

| | | |
|---|---|---|
| JP | 2004-85792 | 3/2004 |
| JP | 2008-66467 | 3/2008 |

(Continued)

*Primary Examiner* — Jerome Jackson, Jr.
*Assistant Examiner* — Wasiul Haider
(74) *Attorney, Agent, or Firm* — Oblon, McClelland, Maier & Neustadt, L.L.P

(57) ABSTRACT

According to an embodiment, a nonvolatile semiconductor memory device comprises: a semiconductor layer; a first gate insulating film; a plurality of floating gate electrodes; a second gate insulating film; a plurality of control gate electrodes; and an upper insulating film. The semiconductor layer is provided on a substrate and extends in a first direction. The floating gate electrode is formed on the semiconductor layer via the first gate insulating film. The control gate electrode faces the upper surface of the floating gate electrode via the second gate insulating film. Moreover, the control gate electrode extends in a second direction intersecting the first direction. The upper insulating film is formed on an upper portion of the plurality of control gate electrodes. Moreover, a height of an upper surface of the upper insulating film changes along the second direction.

5 Claims, 28 Drawing Sheets

(51) Int. Cl.
*H01L 29/51* (2006.01)
*H01L 21/28* (2006.01)
*H01L 21/02* (2006.01)

(56) References Cited

U.S. PATENT DOCUMENTS

2013/0008868 A1  1/2013  Uozumi et al.
2013/0105880 A1*  5/2013  Kim ................. H01L 21/28273
                                                                  257/316
2013/0164929 A1*  6/2013  Kuniya ............... H01L 21/7682
                                                                  438/594

FOREIGN PATENT DOCUMENTS

| JP | 2012-84789 | 4/2012 |
| JP | 2013-16699 | 1/2013 |
| JP | 2013-65775 | 4/2013 |

* cited by examiner

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of U.S. Provisional Patent Application No. 62/036,423, filed on Aug. 12, 2014, the entire contents of which are incorporated herein by reference.

FIELD

Embodiments described here relate to a nonvolatile semiconductor memory device and a method of manufacturing the same.

BACKGROUND

Description of the Related Art

A memory cell configuring a nonvolatile semiconductor memory device such as a NAND type flash memory includes a semiconductor layer, a control gate electrode, and a charge accumulation layer. The memory cell changes its threshold voltage according to a charge accumulated in the charge accumulation layer to store a magnitude of this threshold voltage as data. In recent years, enlargement of capacity and raising of integration level has been proceeding in such a nonvolatile semiconductor memory device.

DETAILED DESCRIPTION

A nonvolatile semiconductor memory device according to an embodiment described below comprises: a semiconductor layer; a first gate insulating film; a plurality of floating gate electrodes; a second gate insulating film; a plurality of control gate electrodes; and an upper insulating film. The semiconductor layer is provided on a substrate and extends in a first direction. The first gate insulating film is formed on the semiconductor layer. The floating gate electrode is formed on the first gate insulating film along the semiconductor layer. The second gate insulating film is formed on an upper surface of the floating gate electrode. The control gate electrode faces the upper surface of the floating gate electrode via the second gate insulating film. Moreover, the control gate electrode extends in a second direction intersecting the first direction. The upper insulating film is formed on upper portions of the plurality of control gate electrodes. Moreover, a height of an upper surface of the upper insulating film is a first height at a first position in the second direction and is a second height lower than the first height at a second position different from the first position in the second direction.

[First Embodiment]
[Overall Configuration]

Figure 1:
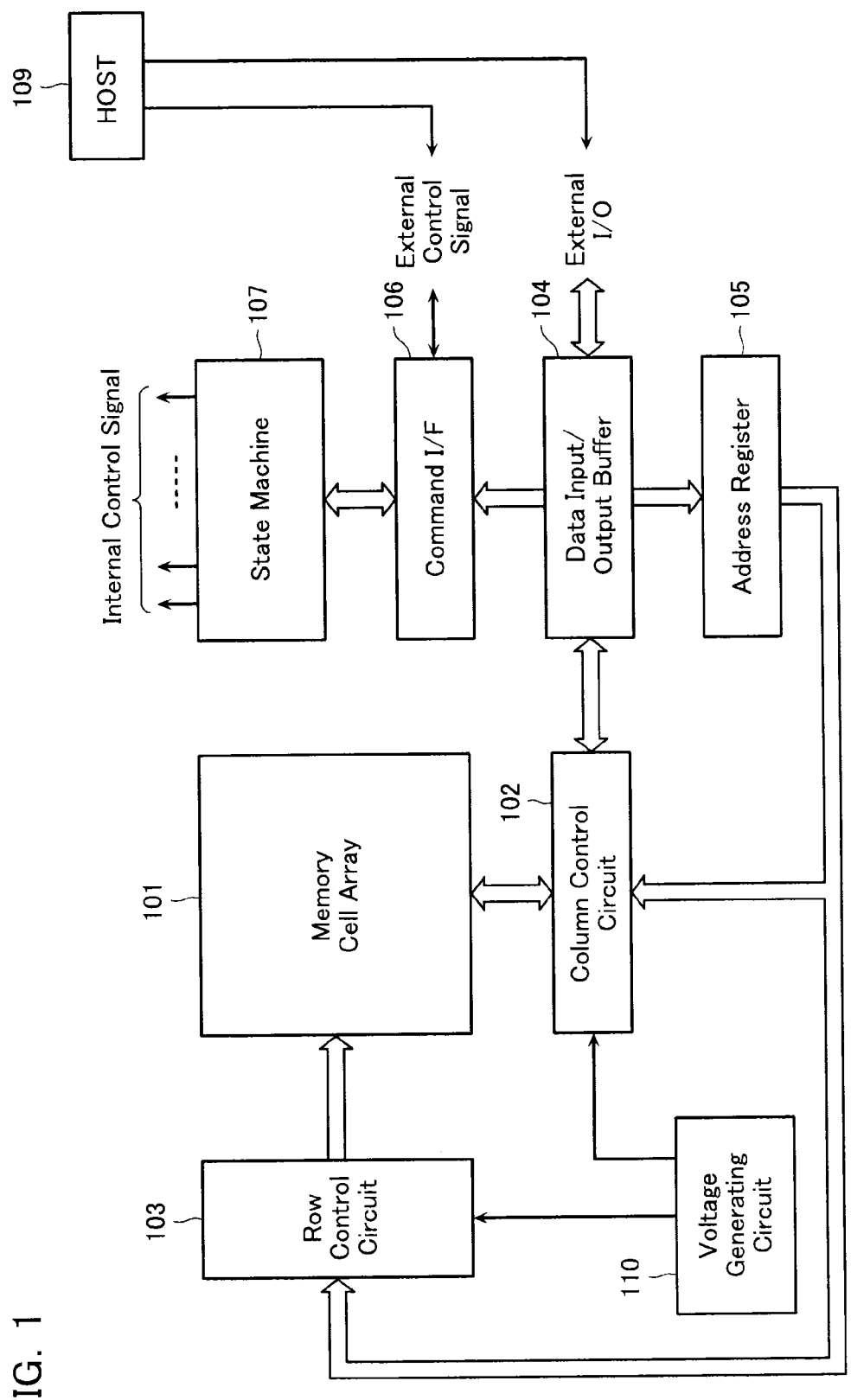
FIG. 1 is a block diagram showing a schematic configuration of a nonvolatile semiconductor memory device according to a first embodiment.

FIG. 1 is a block diagram of a nonvolatile semiconductor memory device according to a first embodiment. This nonvolatile semiconductor memory device includes a memory cell array 101 having a plurality of memory cells MC disposed substantially in a matrix therein, and comprising a bit line BL and a word line WL disposed orthogonally to each other and connected to these memory cells MC. Provided in a periphery of this memory cell array 101 are a column control circuit 102 and a row control circuit 103. The column control circuit 102 controls the bit line BL and performs data erase of the memory cell, data write to the memory cell, and data read from the memory cell. The row control circuit 103 selects the word line WL and applies a voltage for data erase of the memory cell, data write to the memory cell, and data read from the memory cell.

A data input/output buffer 104 is connected to an external host 109, via an I/O line, and receives write data, receives an erase command, outputs read data, and receives address data or command data. The data input/output buffer 104 sends received write data to the column control circuit 102, and receives data read from the column control circuit 102 to be outputted to external. An address supplied to the data input/output buffer 104 from external is sent to the column control circuit 102 and the row control circuit 103 via an address register 105.

Moreover, a command supplied to the data input/output buffer 104 from the host 109 is sent to a command interface 106. The command interface 106 receives an external control signal from the host 109, determines whether data inputted to the data input/output buffer 104 is write data or a command or an address, and, if a command, receives the data and transfers the data to a state machine 107 as a command signal.

The state machine 107 performs management of this nonvolatile memory overall, receives a command from the host 109, via the command interface 106, and performs management of read, write, erase, input/output of data, and so on.

In addition, it is also possible for the external host 109 to receive status information managed by the state machine 107 and judge an operation result. Moreover, this status information is utilized also in control of write and erase.

Furthermore, the state machine 107 controls a voltage generating circuit 110. This control enables the voltage generating circuit 110 to output a pulse of any voltage and any timing.

Now, the pulse formed by the voltage generating circuit 110 can be transferred to any line selected by the column control circuit 102 and the row control circuit 103. These column control circuit 102, row control circuit 103, state machine 107, voltage generating circuit 110, and so on, configure a control circuit in the present embodiment.

[Configuration of Memory Cell Array 101]

Figure 2:
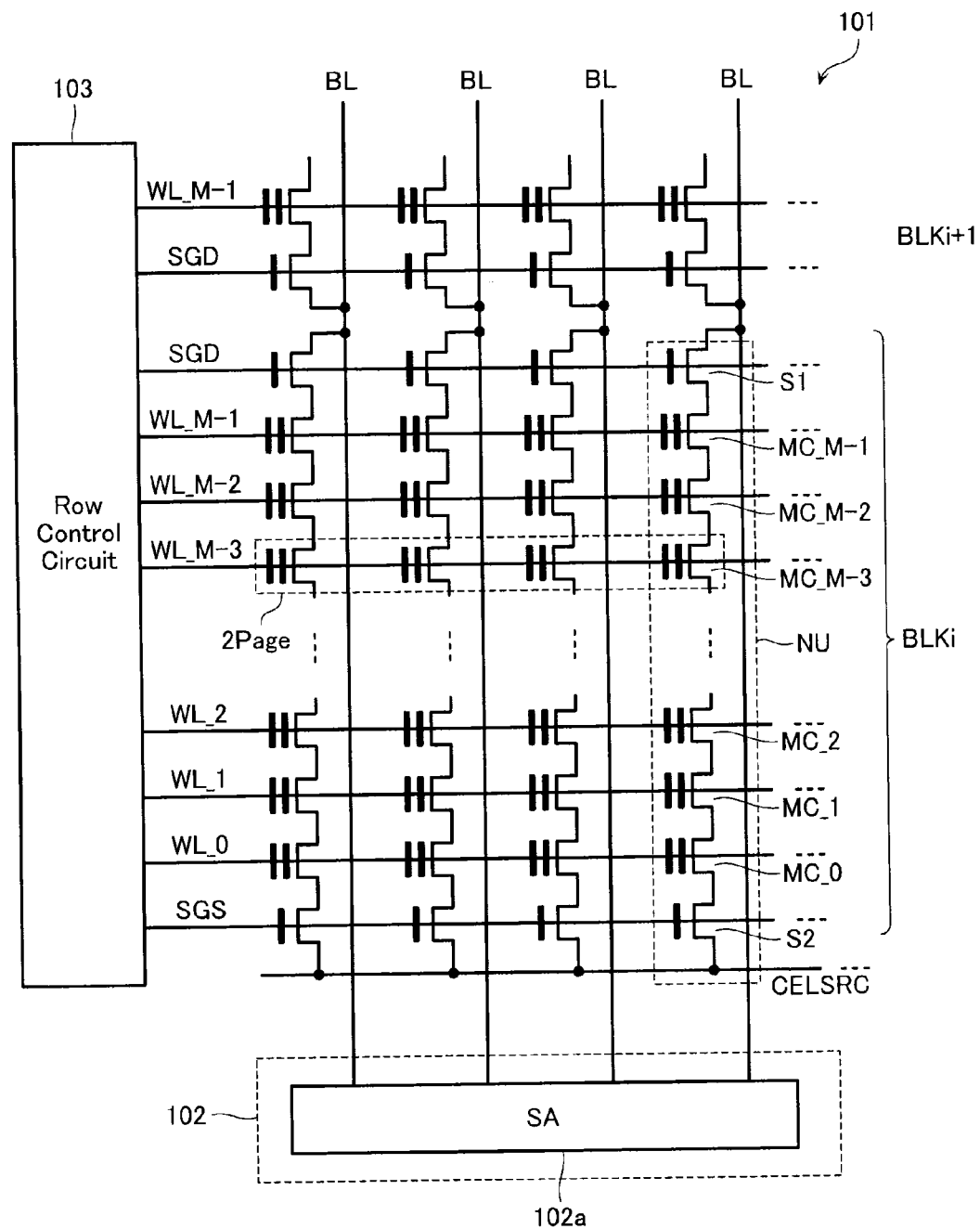
FIG. 2 is a circuit diagram showing a configuration of part of the same nonvolatile semiconductor memory device.

FIG. 2 is a circuit diagram showing a configuration of the memory cell array 101. As shown in FIG. 2, the memory cell array 101 is configured having NAND cell units NU arranged therein, each of the NAND cell units NU being configured having select gate transistors S1 and S2 respectively connected to both ends of a NAND string, the NAND string having M electrically rewritable nonvolatile memory cells MC_0 to MC_M−1 connected in series therein, sharing a source and a drain.

The NAND cell unit NU has one end (a select gate transistor S1 side) connected to the bit line BL and the other end (a select gate transistor S2 side) connected to a common source line CELSRC. Gate electrodes of the select gate transistors S1 and S2 are connected to select gate lines SGD and SGS. In addition, control gate electrodes of the memory cells MC_0 to MC_M−1 are respectively connected to word lines WL_0 to WL_M−1. The bit line BL is connected to a sense amplifier 102a of the column control circuit 102, and the word lines WL_0 to WL_M−1 and select gate lines SGD and SGS are connected to the row control circuit 103.

In the case of 2 bits/cell where 2 bits of data are stored in one memory cell MC, data stored in the plurality of memory cells MC connected to one word line WL configures 2 pages (an upper page UPPER and a lower page LOWER) of data.

One block BLK is formed by the plurality of NAND cell units NU sharing the word line WL. One block BLK forms a single unit of a data erase operation. The number of word lines WL in one block BLK in one memory cell array 101 is M, and, in the case of 2 bits/cell, the number of pages in one block is M×2 pages.

Figure 3:
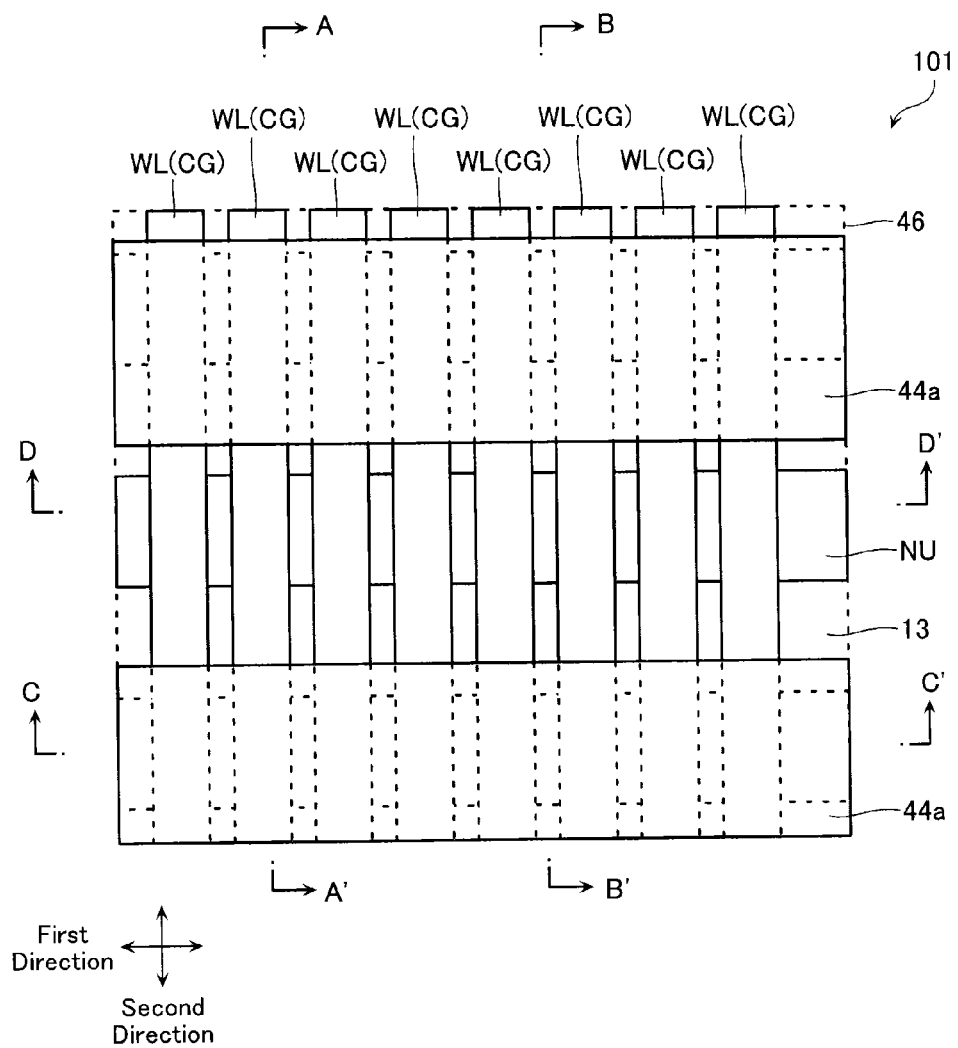
FIG. 3 is a schematic plan view showing a configuration of part of the same nonvolatile semiconductor memory device.
Figure 4:
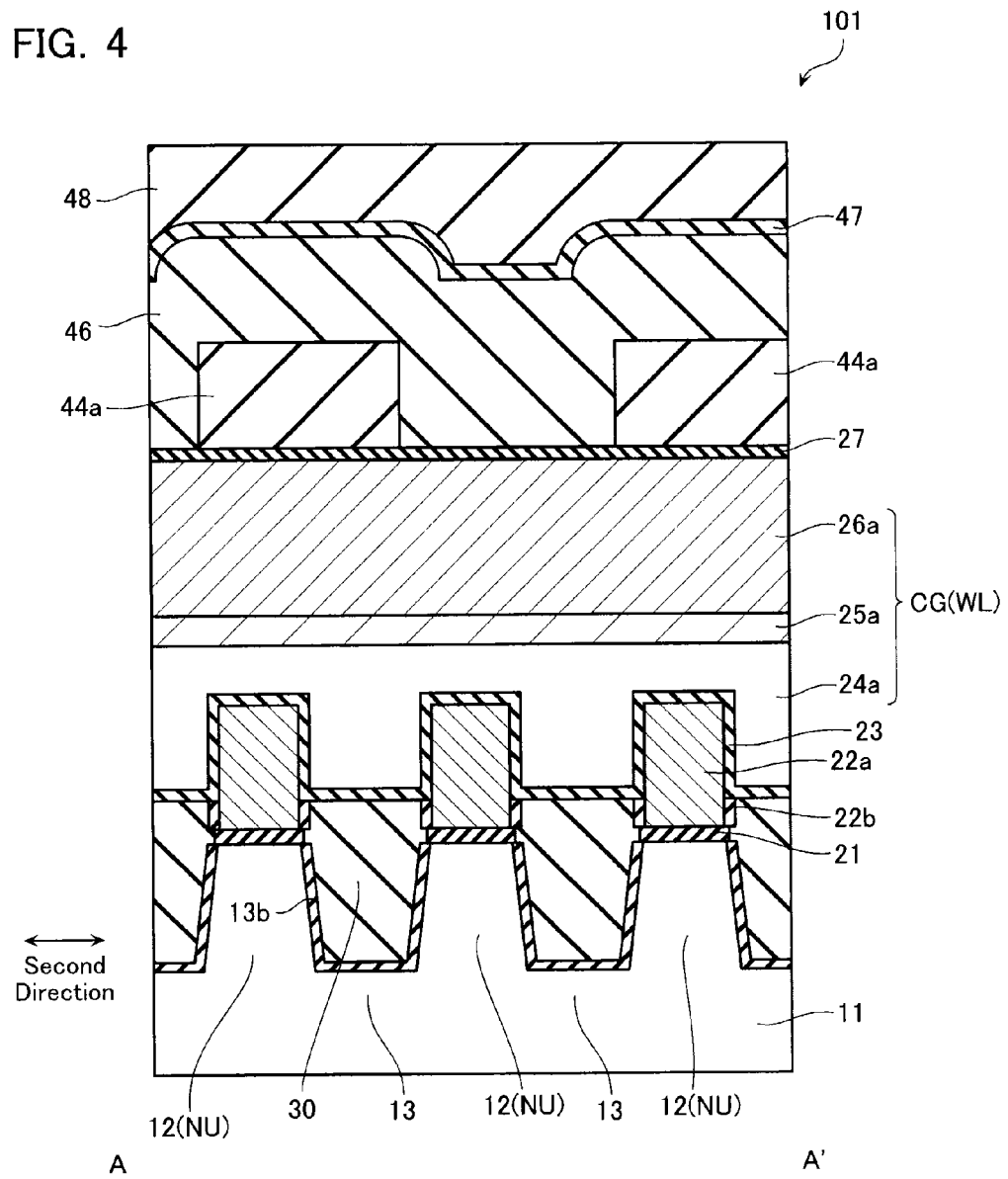
FIG. 4 is a schematic cross-sectional view showing a configuration of part of the same nonvolatile semiconductor memory device.
Figure 5:
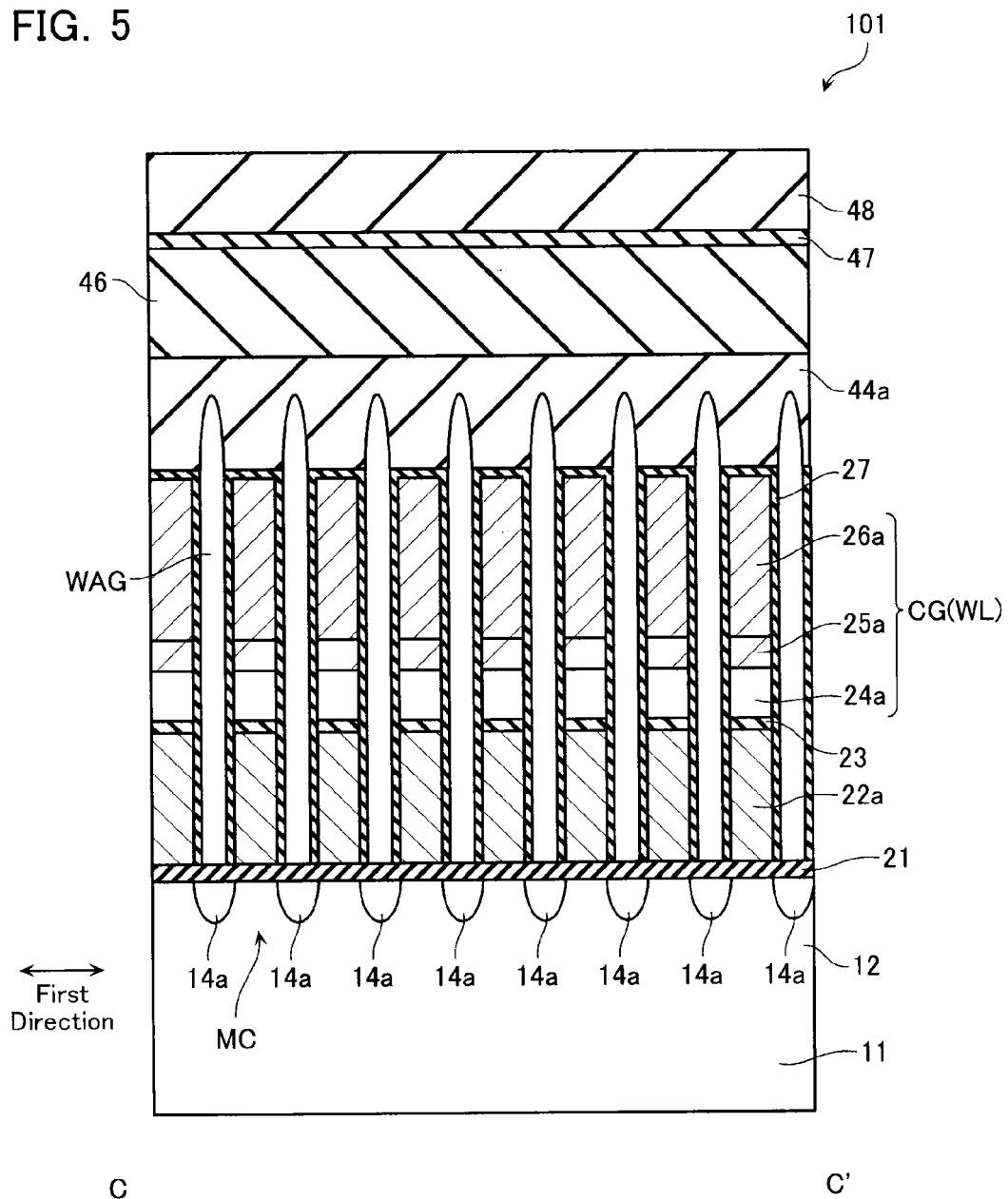
FIG. 5 is a schematic cross-sectional view showing a configuration of part of the same nonvolatile semiconductor memory device.
Figure 6:
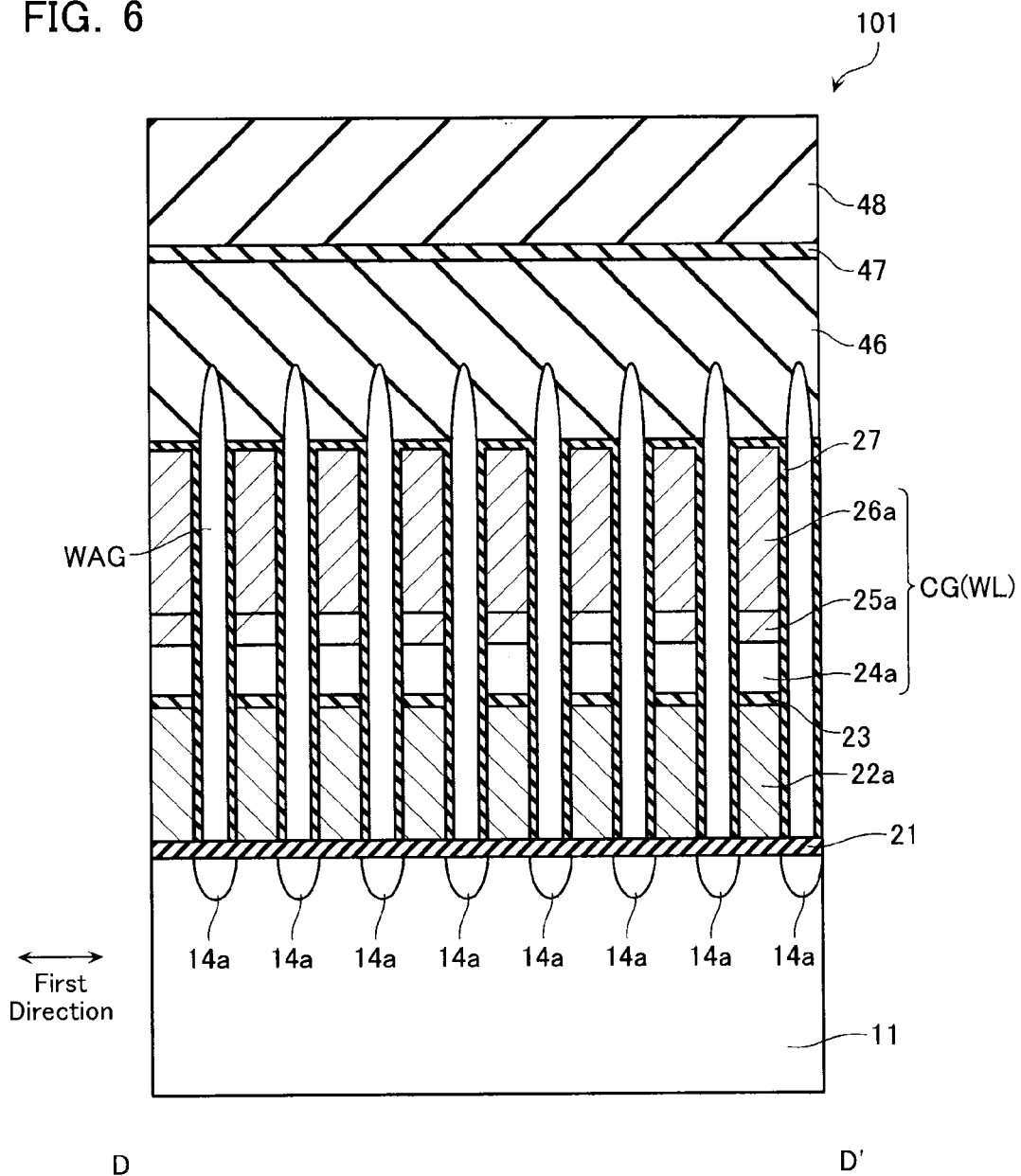
FIG. 6 is a schematic cross-sectional view showing a configuration of part of the same nonvolatile semiconductor memory device.
Figure 7:
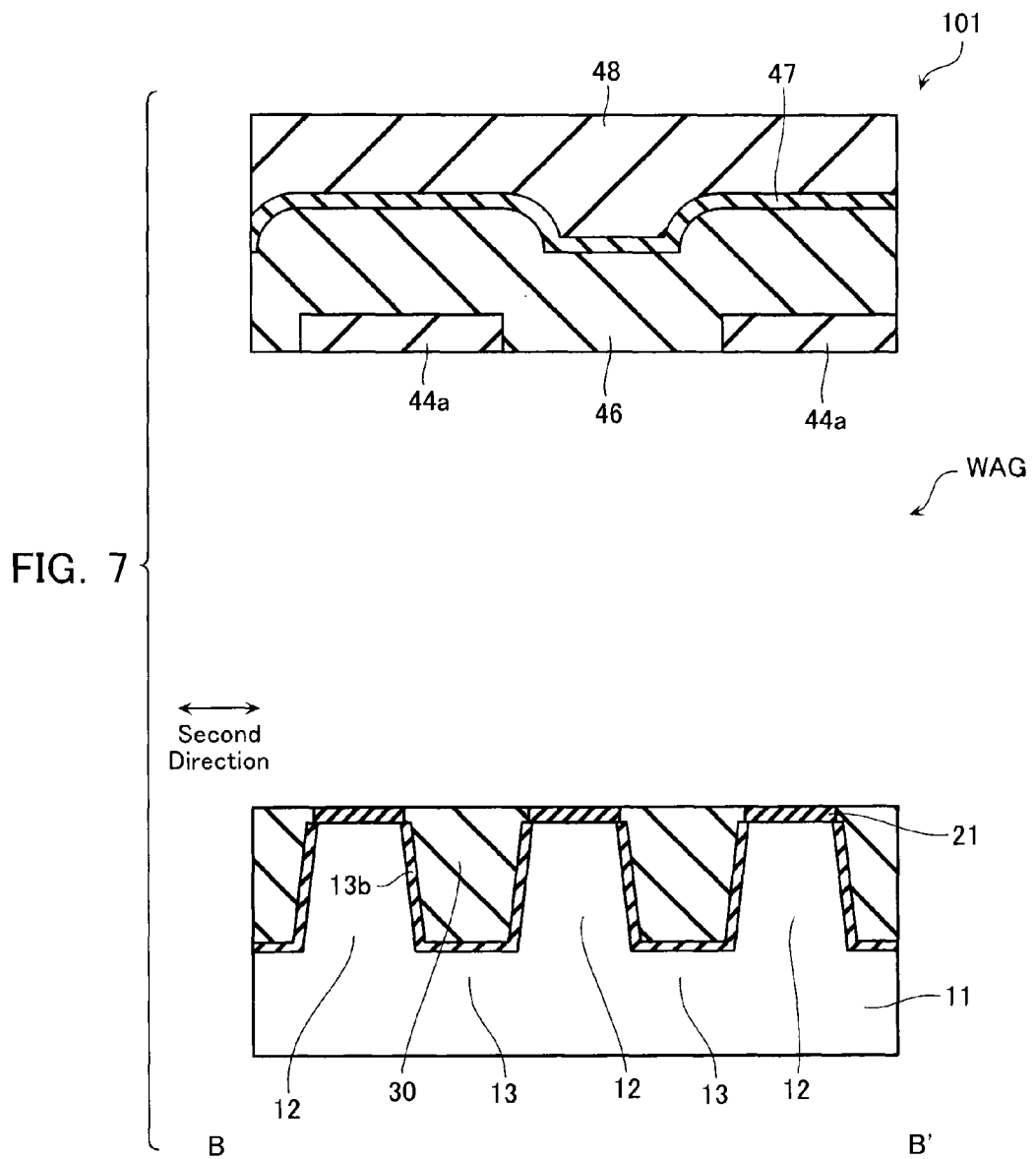
FIG. 7 is a schematic cross-sectional view showing a configuration of part of the same nonvolatile semiconductor memory device.

FIG. 3 is a schematic plan view showing a configuration of part of the memory cell array 101. FIGS. 4 to 7 are schematic cross-sectional views each showing a configuration of part of the memory cell array 101. FIG. 4 shows schematically a cross-section (the A-A' cross-section of FIG. 3) where the memory cell array 101 is sectioned along the word line WL. Moreover, FIGS. 5 and 6 show schematically cross-sections where the memory cell array 101 is sectioned along the NAND cell unit NU, and respectively show the C-C' cross-section and the D-D' cross-section of FIG. 3. Furthermore, FIG. 7 shows schematically a cross-section (the B-B' cross-section of FIG. 3) where the memory cell array 101 is sectioned avoiding the word line WL (is sectioned between adjacent word lines WL).

As shown in FIG. 3, the memory cell array 101 comprises: a plurality of the NAND cell units NU extending in a first direction and disposed in plurality in a second direction; and a plurality of the word lines WL (control gate electrodes CG) extending in the second direction and disposed in plurality in the first direction. Moreover, formed on an upper portion of these plurality of word lines WL (control gate electrodes CG) are a plurality of collapse-prevention insulating layers 44a extending in the first direction and disposed in plurality in the second direction, and a filler insulating film 46 that covers an upper surface of the plurality of collapse-prevention insulating layers 44a. The collapse-prevention insulating layer 44a is formed so as to straddle the plurality of control gate electrodes CG, and prevents collapse of the control gate electrode CG in a manufacturing process.

As shown in FIG. 5, the memory cell array 101 is formed on a silicon substrate 11, and includes the plurality of memory cells MC forming the NAND cell unit NU. The plurality of memory cells MC are arranged with a certain spacing along a semiconductor layer 12 of an upper portion of the silicon substrate 11, and share a source/drain diffusion layer 14a between fellow adjacent memory cells MC. Moreover, a gap WAG (cavity) is formed between the plurality of memory cells MC.

In addition, as shown in FIG. 4, a plurality of such NAND cell units NU are formed with a certain spacing in the second direction. Formed in a portion of the silicon substrate 11 between the semiconductor layers 12 where the NAND cell units NU are formed is an element isolation trench 13 that has an insulating film 13b formed on its inner wall and has an insulating film 22b formed on a lower side surface of a later-described floating gate electrode 22a. Moreover, formed inside the element isolation trench 13 is an element isolation insulating film 30. Note that as shown in FIG. 4, in the present embodiment, an upper surface of the element isolation insulating film 30 is formed higher than an upper surface of a later-described first gate insulating film 21 in a region positioned below the word line WL.

As shown in FIG. 5, each of the memory cells MC is configured having stacked sequentially therein: the semiconductor layer 12; the first gate insulating film 21 (lower gate insulating film) which is a tunnel insulating film; the floating gate electrode 22a; a second gate insulating film 23 (upper gate insulating film); and the control gate electrode CG. Moreover, sidewalls of these configurations and an upper surface of the control gate electrode CG are covered by a sidewall insulating film 27.

As shown in FIG. 4, the control gate electrode CG is continuously pattern formed straddling a plurality of the semiconductor layers 12 in the second direction to configure the word line WL. The control gate electrode CG faces an upper surface and side surfaces of the floating gate electrode 22a via the second gate insulating film 23 (upper gate insulating film).

The control gate electrode CG includes a polysilicon film 24a, a barrier metal film 25a, and a metallic layer 26a. Now, the barrier metal film 25a is configured from, for example, tungsten nitride (WN), and the metallic layer 26a is configured from, for example, tungsten (W). However, a configuration and a material of the control gate electrode CG may be changed appropriately.

In addition, as shown in FIG. 4, a plurality of the collapse-prevention insulating layers 44a are formed periodically on an upper surface of the word line WL via the sidewall insulating film 27. Moreover, these plurality of collapse-prevention insulating layers 44a are covered by the filler insulating film 46. These plurality of collapse-prevention insulating layers 44a and the filler insulating film 46 configure an upper insulating film. A portion of the filler insulating film 46 on an upper surface of the collapse-prevention insulating layer 44a is formed flatly along this upper surface. Moreover, a portion of the filler insulating film 46 between the collapse-prevention insulating layers 44a enters between the collapse-prevention insulating layers 44a. Furthermore, a height of an upper surface of the filler insulating film 46 is formed higher at the portion positioned on the upper surface of the collapse-prevention insulating layer 44a compared to at the portion positioned between these collapse-prevention insulating layers 44a. Therefore, a height of an upper surface of the upper insulating film configured from the plurality of collapse-prevention insulating layers 44a and the filler insulating film 46 changes periodically along the second direction. In other words, in the second direction, the height of an upper surface of the upper insulating film is a first height in a portion in which the collapse-prevention insulating layers 44a is positioned and the height of the upper surface of the upper insulating film is a second height lower than the first height in a portion in which the collapse-prevention insulating layers 44a is not positioned.

Moreover, as shown in FIG. 5, the collapse-prevention insulating layer 44a extends in the first direction.

In addition, as shown in FIG. 4, the upper surface of the filler insulating film 46 is covered by a silicon nitride film 47. The silicon nitride film 47 is formed in a knobby fashion along the upper surfaces of the plurality of collapse-prevention insulating layers 44a and the filler insulating film 46. Therefore, a height of the silicon nitride film 47 also changes periodically along the second direction. That is, in the second direction, the height of an upper surface of silicon nitride film 47 is a third height in a portion in which the collapse-prevention insulating layers 44a is positioned and the height of the upper surface of the silicon nitride film 47 is a fourth height lower than the third height in a portion in which the collapse-prevention insulating layers 44a is not positioned. Moreover, an insulating layer 48 is further formed on an upper surface of the silicon nitride film 47.

As shown in FIG. 4 or 7, in the nonvolatile semiconductor memory device according to the present embodiment, the height of the upper surface of the upper insulating film configured from the plurality of collapse-prevention insulating layers 44a and the filler insulating film 46 changes along the second direction. As will be described in detail later, in such a nonvolatile semiconductor memory device, it is made possible by the collapse-prevention insulating layer 44a to clean between the plurality of word lines WL while mechanically supporting the upper surface of the word lines WL and preventing collapse of the word line WL in the first direction. Therefore, the nonvolatile semiconductor memory device according to the present embodiment can be stably manufactured.

[Method of Manufacturing]

Figure 32:
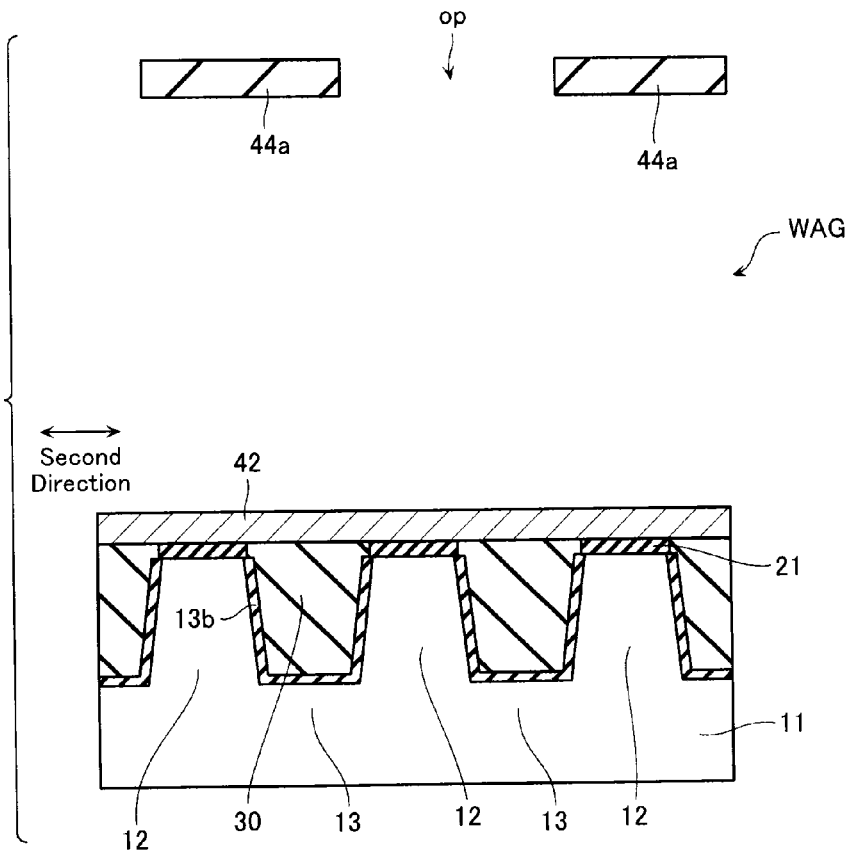
FIG. 32 is a cross-sectional view showing a manufacturing process of the same nonvolatile semiconductor memory device.
Figure 33:
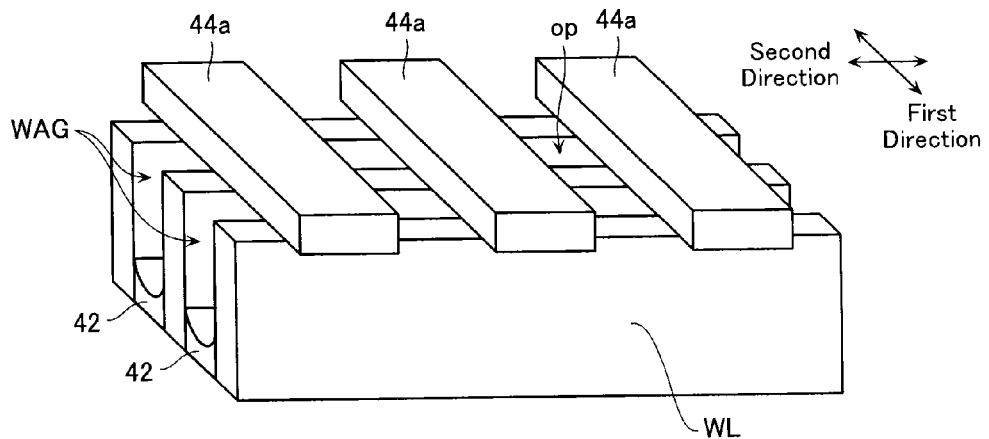
FIG. 33 is a perspective view showing a manufacturing process of the same nonvolatile semiconductor memory device.
Figure 34:
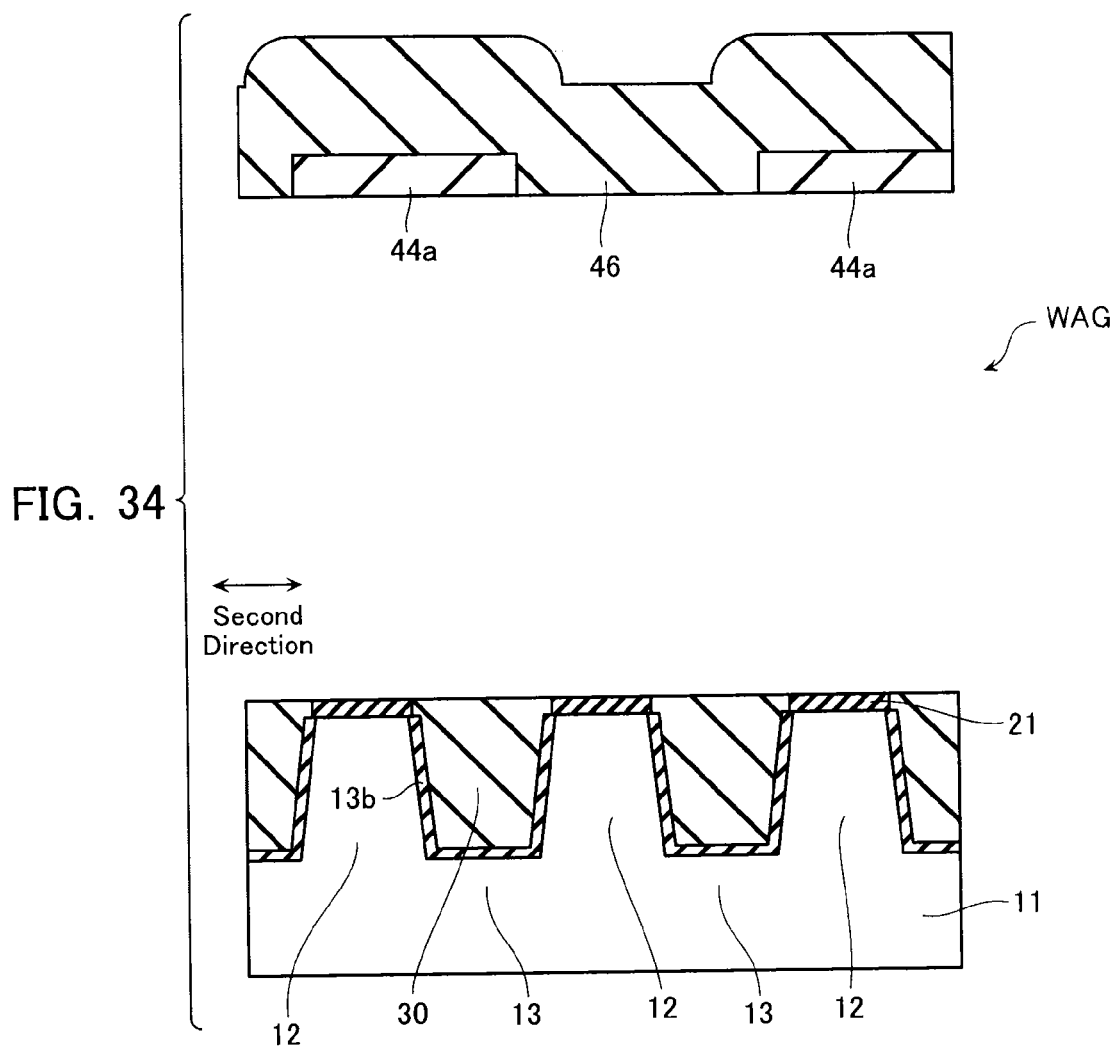
FIG. 34 is a cross-sectional view showing a manufacturing process of the same nonvolatile semiconductor memory device.
Figure 35:
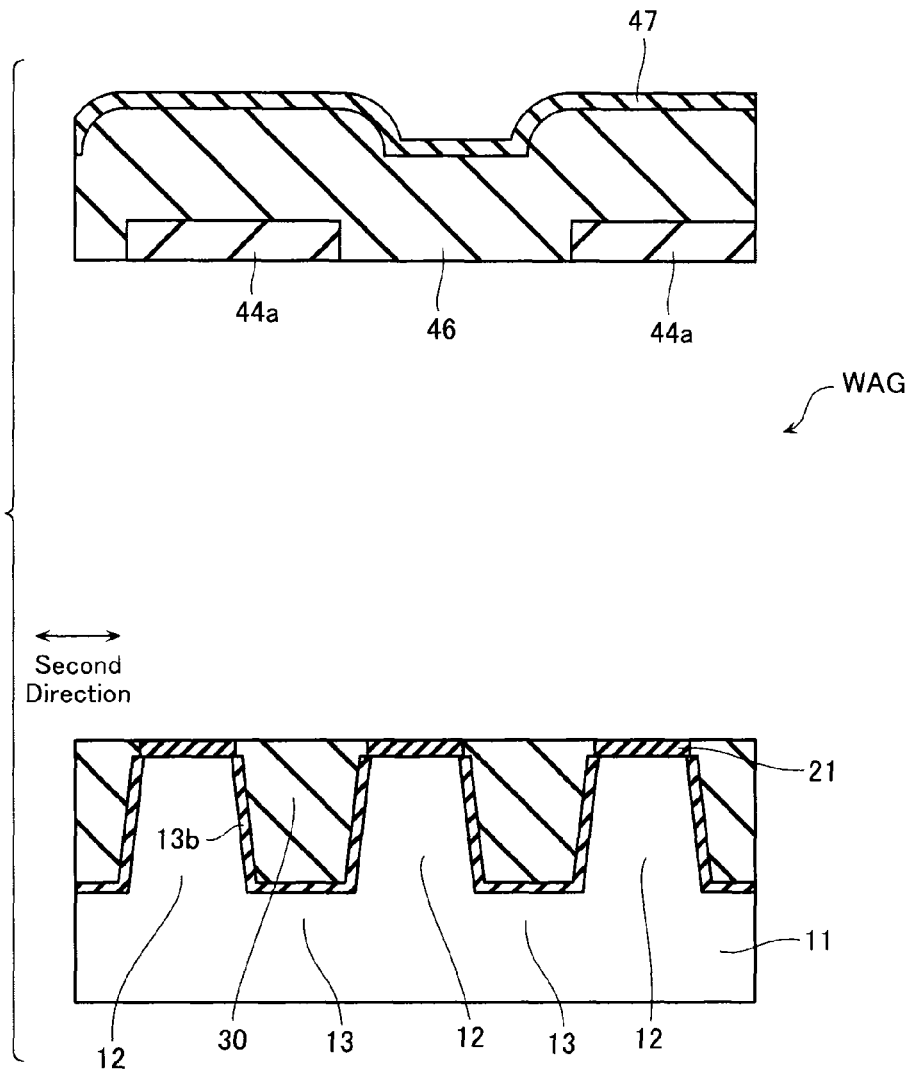
FIG. 35 is a cross-sectional view showing a manufacturing process of the same nonvolatile semiconductor memory device.

Next, a method of manufacturing the nonvolatile semiconductor memory device according to the first embodiment will be described with reference to FIGS. 8 to 35. FIGS. 8 to 17, 19, 20, 22 to 24, 26, 28, 30, 32, 34, and 35 are schematic cross-sectional views each showing a manufacturing process of the nonvolatile semiconductor memory device according to the present embodiment. FIGS. 8 to 15, 24, 26, 28, and 30 show cross-sections corresponding to FIG. 4. FIGS. 16, 17, 19, 20, 22, and 23 show cross-sections corresponding to FIG. 5. FIGS. 18, 21, 25, 27, 29, and 31 show schematic plan views. FIGS. 32, 34, and 35 show cross-sections corresponding to FIG. 7. FIG. 33 is a schematic perspective view showing a manufacturing process of the nonvolatile semiconductor memory device according to the present embodiment.

Figure 8:
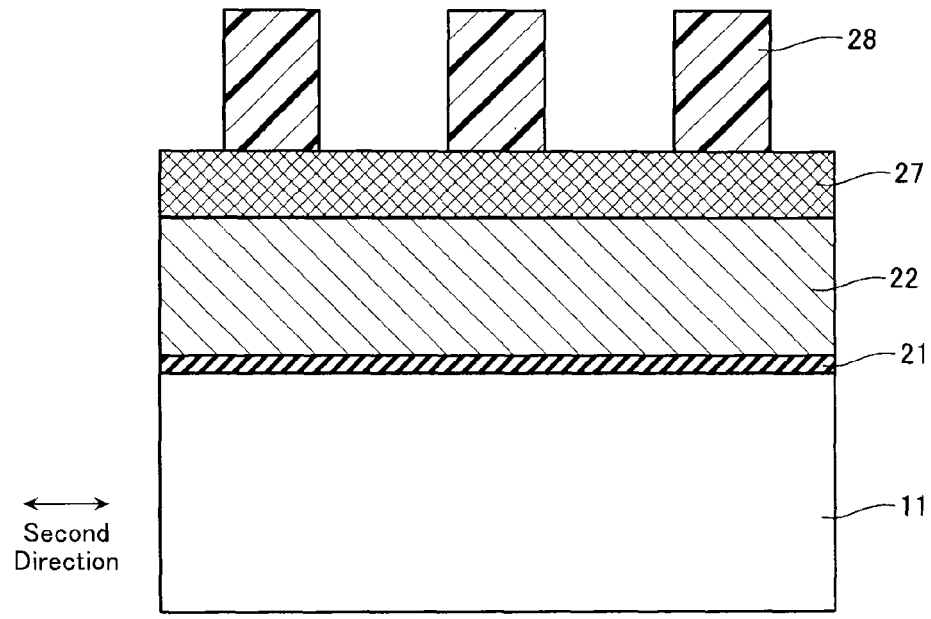
FIG. 8 is a cross-sectional view showing a manufacturing process of the same nonvolatile semiconductor memory device.

First, as shown in FIG. 8, a silicon oxide film is formed on the silicon substrate 11 as the first gate insulating film 21, a polysilicon film 22 is deposited on this silicon oxide film as a material film of the floating gate electrode 22a, and furthermore, the silicon nitride film 27 is formed as a stopper film in a CMP (chemical mechanical polishing) process. In addition, a resist pattern 28 is formed on the silicon nitride film 27.

Figure 9:
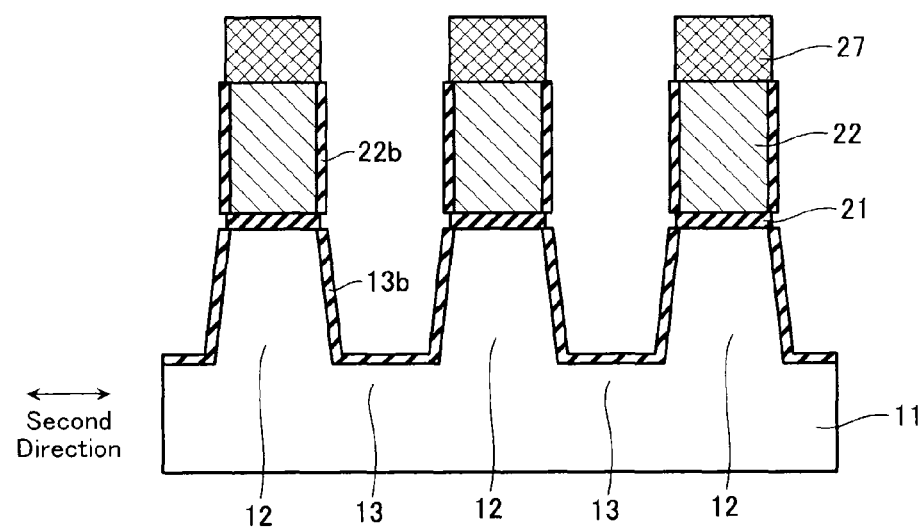
FIG. 9 is a cross-sectional view showing a manufacturing process of the same nonvolatile semiconductor memory device.

Next, as shown in FIG. 9, the silicon nitride film 27, the polysilicon film 22, the first gate insulating film 21, and an upper portion of the silicon substrate 11 are etched using the resist pattern 28 as an etching mask. As a result, the semiconductor layer 12 where the memory cell MC is formed, and the element isolation trench 13 that partitions this, are formed. Moreover, in this process, the silicon nitride film 27, the polysilicon film 22, and the first gate insulating film 21 are divided in the second direction. Next, in order to remove damage due to etching, the silicon oxide film 22b is formed on side surfaces of the polysilicon film 22 and the silicon oxide film 13b is formed on side surfaces and a bottom surface of the element isolation trench 13, by a thermal oxidation method.

Figure 10:
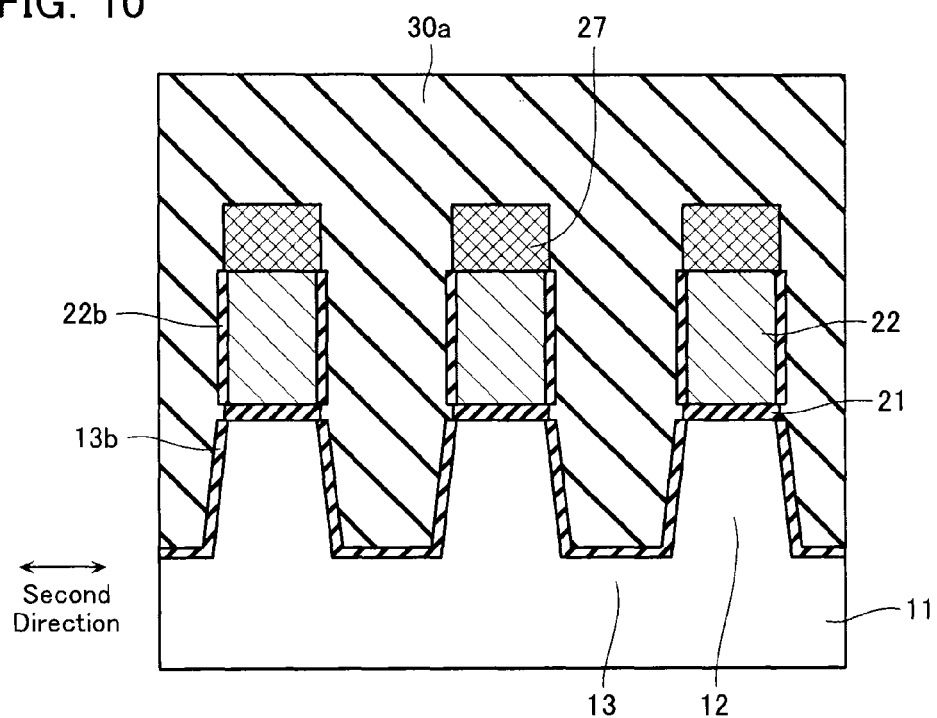
FIG. 10 is a cross-sectional view showing a manufacturing process of the same nonvolatile semiconductor memory device.

Next, as shown in FIG. 10, a silicon oxide film is formed and adopted as an element isolation insulating film formation layer 30a that forms the element isolation insulating film 30. The element isolation insulating film formation layer 30a is deposited on an entire surface including on the silicon nitride film 27 formed on the semiconductor layer 12, not only in the element isolation trench 13.

Figure 11:
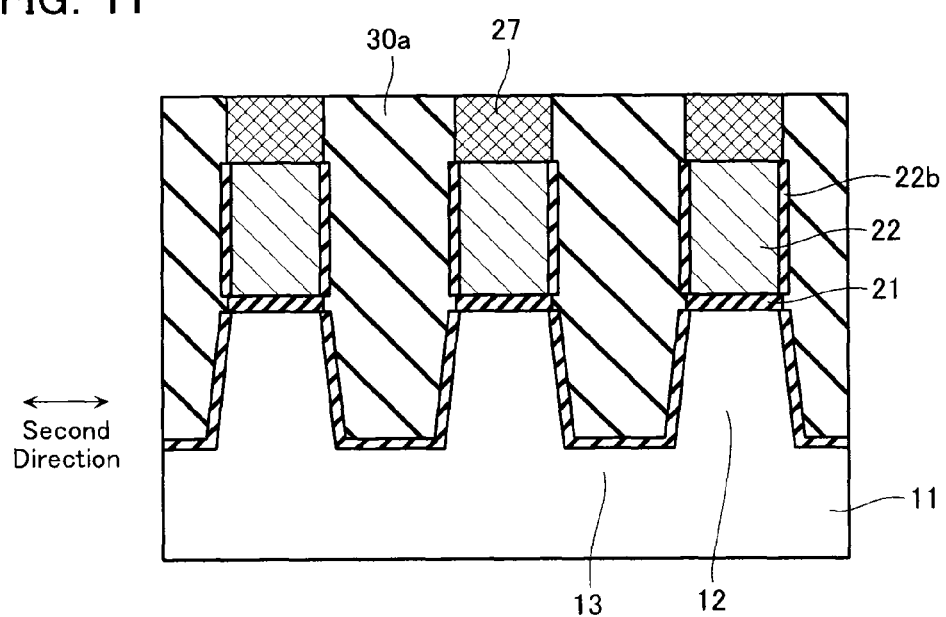
FIG. 11 is a cross-sectional view showing a manufacturing process of the same nonvolatile semiconductor memory device.

Next, as shown in FIG. 11, the element isolation insulating film formation layer 30a is removed/planarized to an upper surface of the silicon nitride film 27 by a CMP method using the silicon nitride film 27 as a stopper film.

Figure 12:
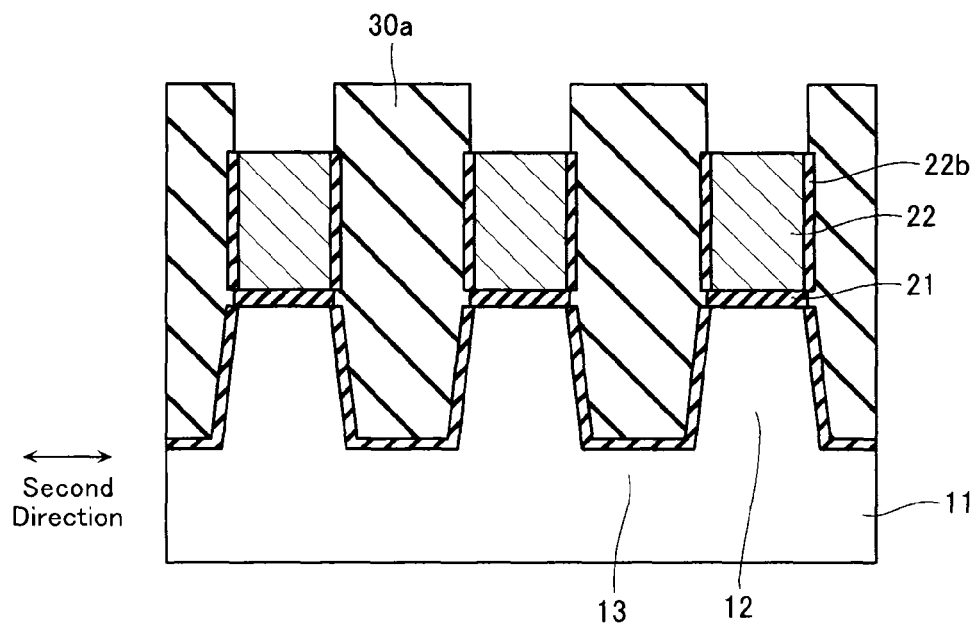
FIG. 12 is a cross-sectional view showing a manufacturing process of the same nonvolatile semiconductor memory device.

Then, as shown in FIG. 12, the silicon nitride film 27 is removed by phosphating, and an upper surface of the polysilicon film 22 is exposed.

Figure 13:
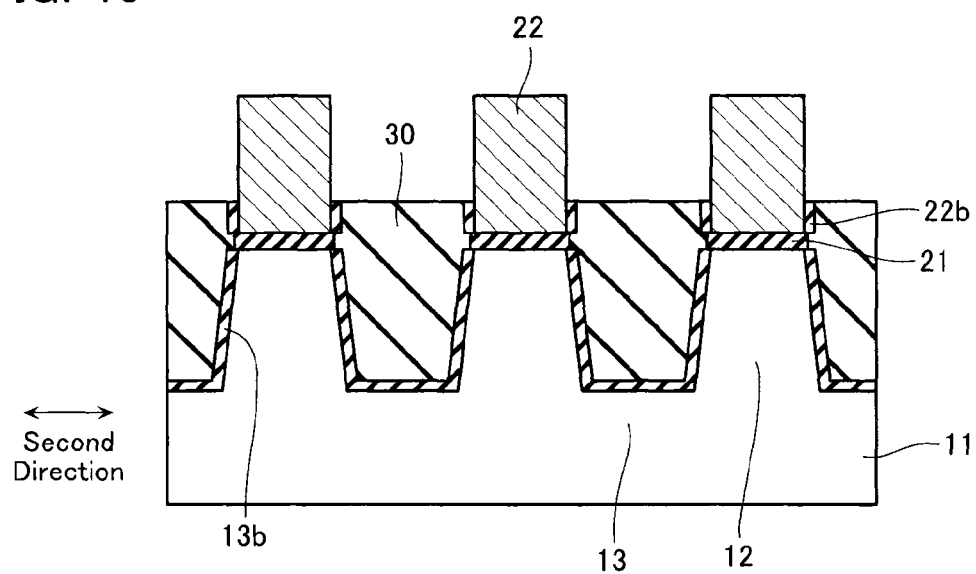
FIG. 13 is a cross-sectional view showing a manufacturing process of the same nonvolatile semiconductor memory device.

Then, as shown in FIG. 13, part of the element isolation insulating film formation layer 30a and part of the silicon oxide film 22b are removed by etching employing hydrofluoric acid to form the element isolation insulating film 30.

Figure 14:
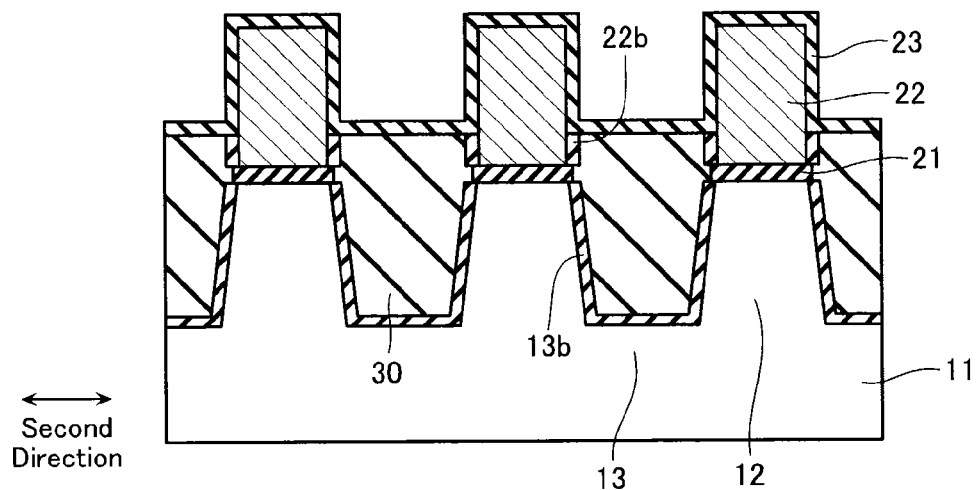
FIG. 14 is a cross-sectional view showing a manufacturing process of the same nonvolatile semiconductor memory device.

Next, as shown in FIG. 14, an ONO film of a certain thickness is formed on the upper surface and side surfaces of the polysilicon film 22 and on the element isolation insulating film 30, by a reduced pressure CVD method, as the second gate insulating film 23. The ONO film is an insulating film of a three-layer structure having formed stacked sequentially therein a first silicon oxide film, a silicon nitride film, and a second silicon oxide film.

Figure 15:
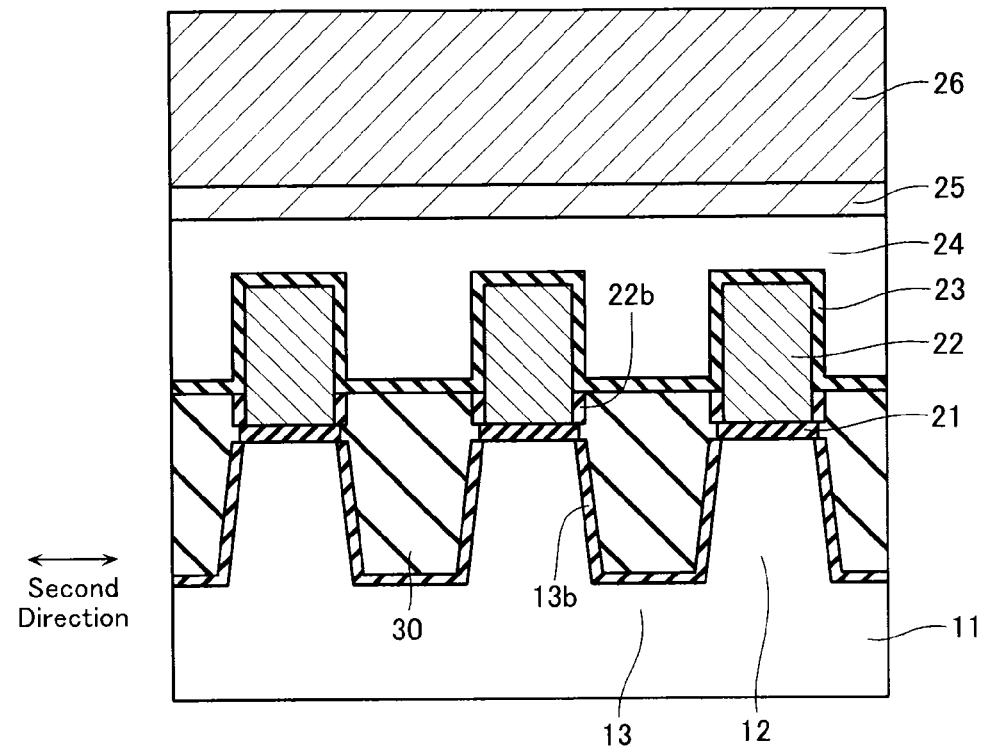
FIG. 15 is a cross-sectional view showing a manufacturing process of the same nonvolatile semiconductor memory device.

Following this, as shown in FIG. 15, a polysilicon film 24, a barrier metal film 25, and a metallic layer 26 are formed sequentially on this second gate insulating film 23, as materials of the control gate electrode CG.

Figure 16:
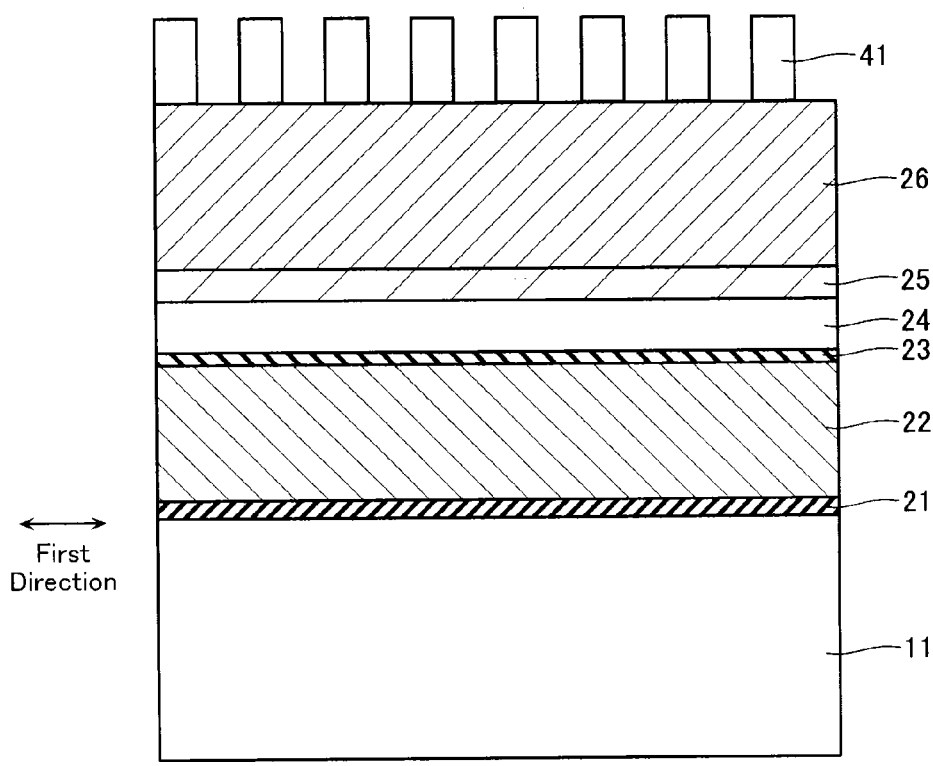
FIG. 16 is a cross-sectional view showing a manufacturing process of the same nonvolatile semiconductor memory device.
Figure 17:
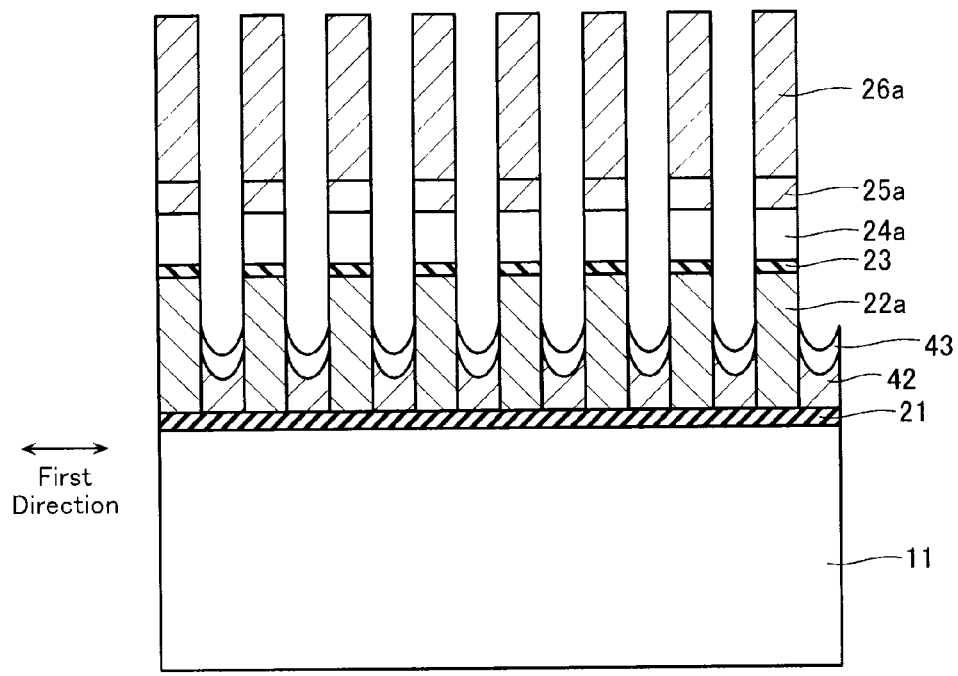
FIG. 17 is a cross-sectional view showing a manufacturing process of the same nonvolatile semiconductor memory device.
Figure 18:
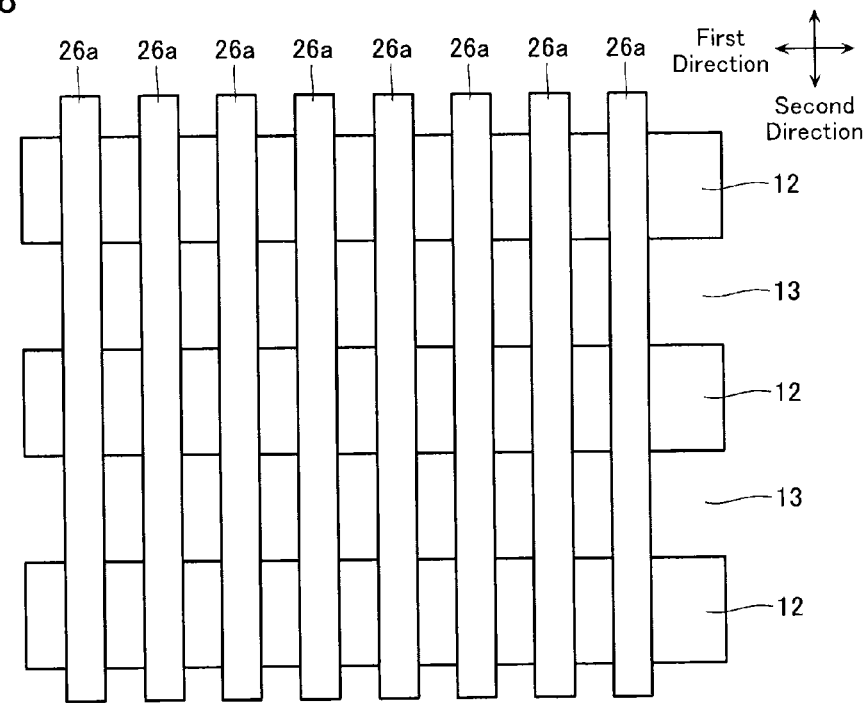
FIG. 18 is a plan view showing a manufacturing process of the same nonvolatile semiconductor memory device.

Next, as shown in FIG. 16, a mask layer 41 is formed on the metallic layer 26. Next, as shown in FIGS. 17 and 18, etching is performed using the mask layer 41 as a mask, and the metallic layer 26, the barrier metal film 25, the polysilicon film 24, the second gate insulating film 23, and the polysilicon film 22 undergo patterning. As a result, as shown in FIG. 17, the polysilicon film 22 is formed in a shape of the floating gate electrode 22a of each of the memory cells MC, and the polysilicon film 24, the barrier metal film 25, and the metallic layer 26 are formed in shapes of the films 24a, 25a, and 26a forming the control gate electrode CG of each of the memory cells MC. Moreover, as shown in FIG. 17, a residue 42 of the metallic layer 26 and another by-product 43 are generated in this process.

Figure 19:
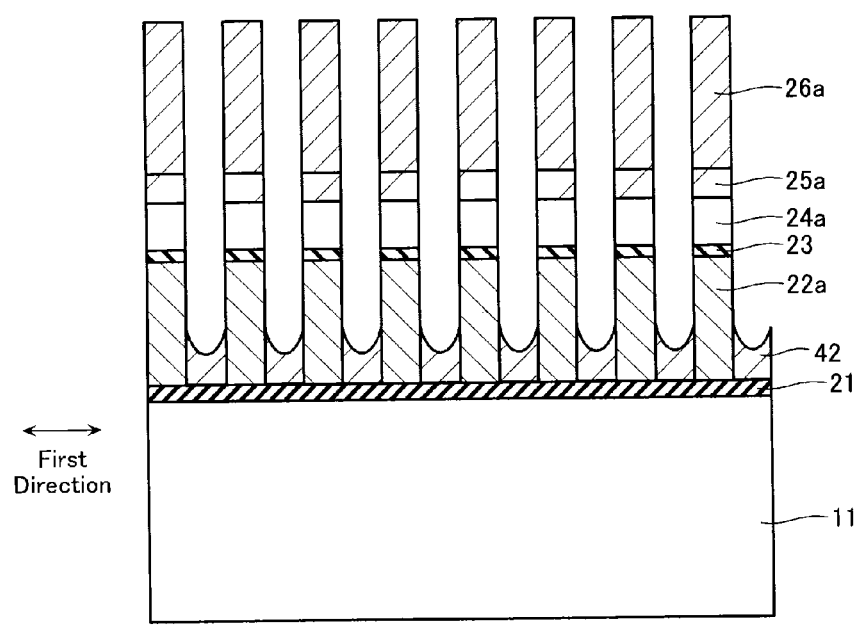
FIG. 19 is a cross-sectional view showing a manufacturing process of the same nonvolatile semiconductor memory device.

Next, as shown in FIG. 19, cleaning treatment is performed and the by-product 43 is removed. The cleaning treatment in this process is performed by, for example, dry treatment.

Figure 20:
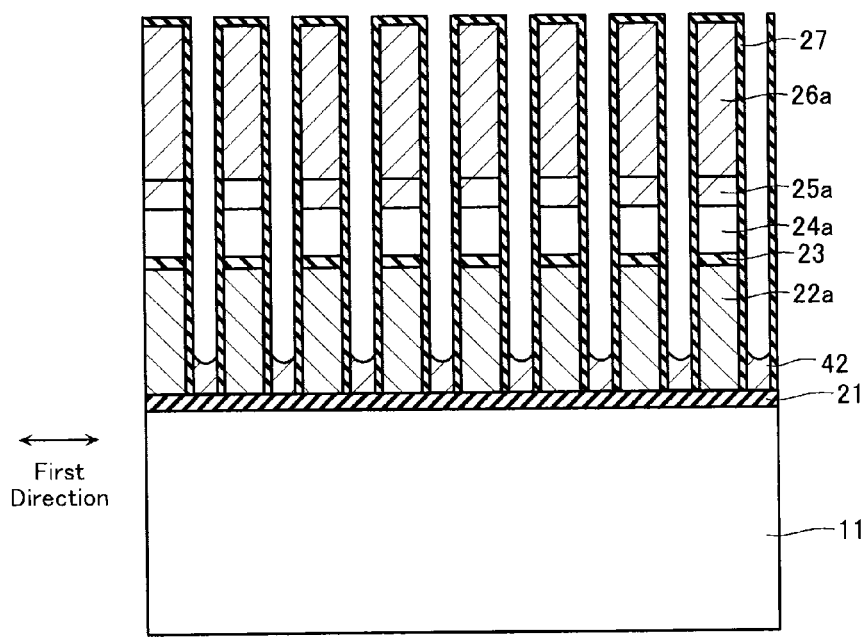
FIG. 20 is a cross-sectional view showing a manufacturing process of the same nonvolatile semiconductor memory device.
Figure 21:
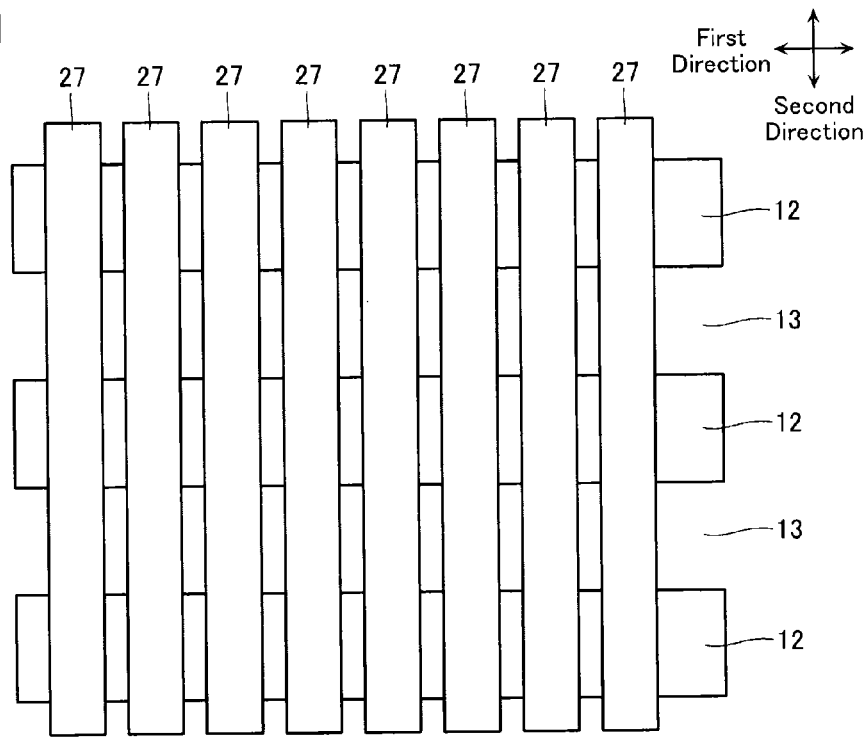
FIG. 21 is a cross-sectional view showing a manufacturing process of the same nonvolatile semiconductor memory device.

Next, as shown in FIGS. 20 and 21, the sidewall insulating film 27 is formed on sidewalls of the metallic layer 26a, the barrier metal film 25a, the polysilicon film 24a, the second gate insulating film 23, and the polysilicon film 22a, and on an upper surface of the metallic layer 26a.

Figure 22:
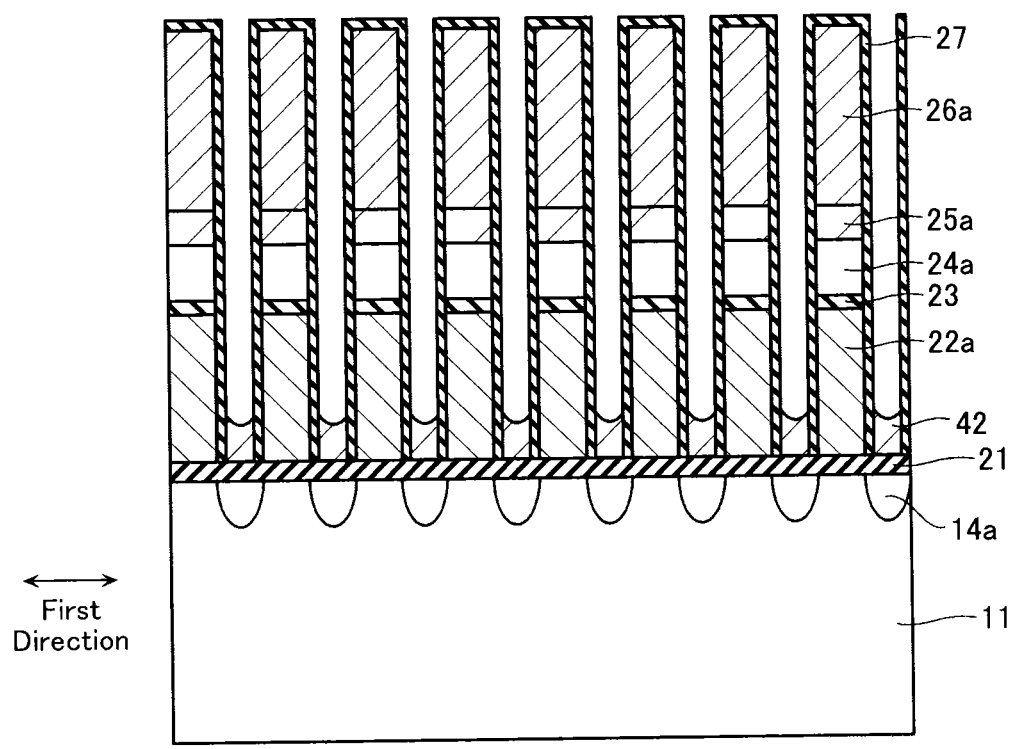
FIG. 22 is a cross-sectional view showing a manufacturing process of the same nonvolatile semiconductor memory device.

Next, as shown in FIG. 22, for example, an ion implantation method is performed using the word line WL as a mask and ions are implanted in an upper surface of the silicon substrate 11 to generate the source/drain diffusion layer 14a.

Figure 23:
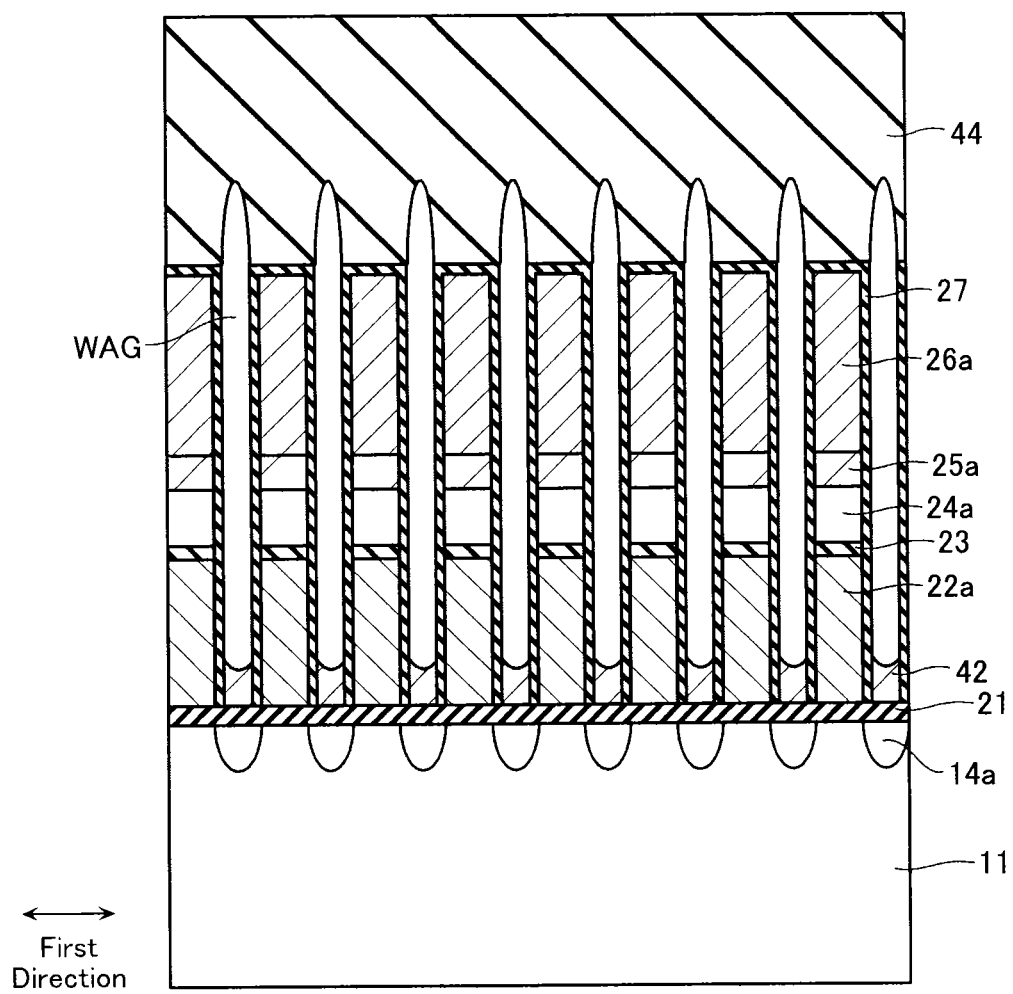
FIG. 23 is a cross-sectional view showing a manufacturing process of the same nonvolatile semiconductor memory device.
Figure 24:
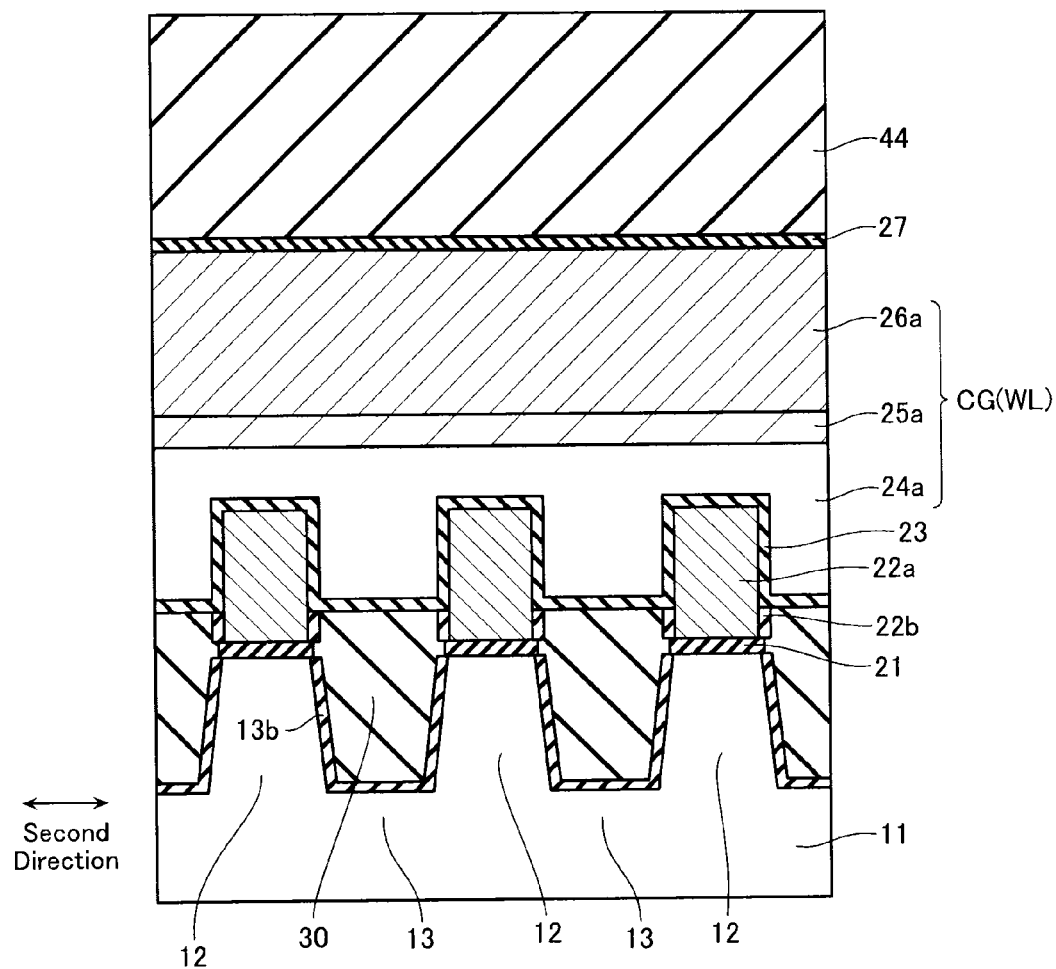
FIG. 24 is a cross-sectional view showing a manufacturing process of the same nonvolatile semiconductor memory device.
Figure 25:
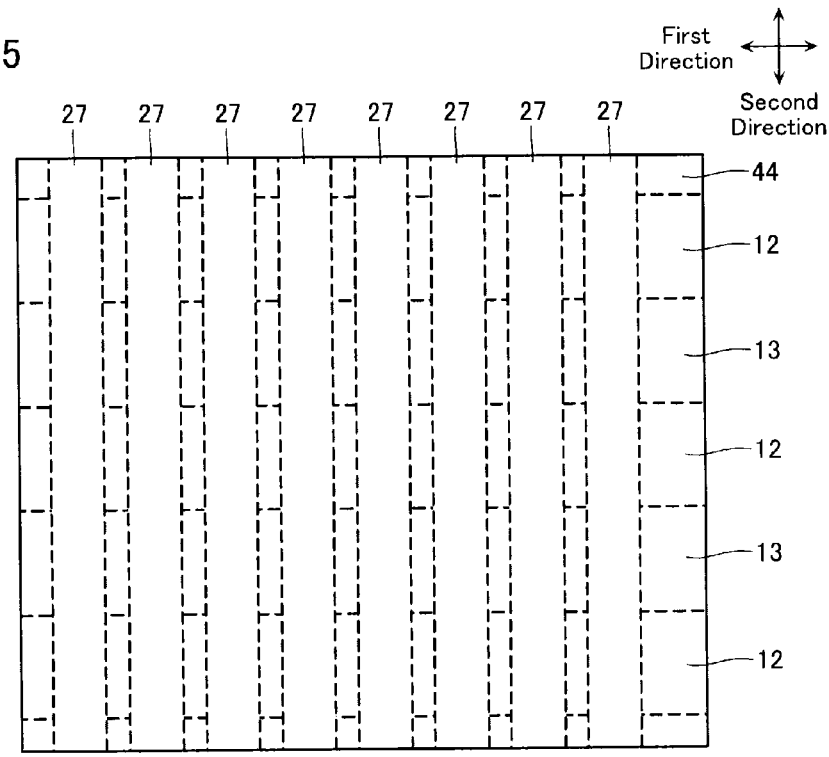
FIG. 25 is a plan view showing a manufacturing process of the same nonvolatile semiconductor memory device.

Next, as shown in FIGS. 23, 24, and 25, a collapse-prevention insulating film formation layer 44 is formed on an upper portion of the metallic layer 26a via the sidewall insulating film 27. The collapse-prevention insulating film formation layer 44 covers an entire surface of a region where the memory cell array 101 is formed. Moreover, by employing, for example, an insulating material such as plasma silane (P—$SiH_4$), the collapse-prevention insulating film formation layer 44 is formed so as not to fill in between the word lines WL. As a result, the gap WAG is generated between the memory cells MC.

Figure 27:
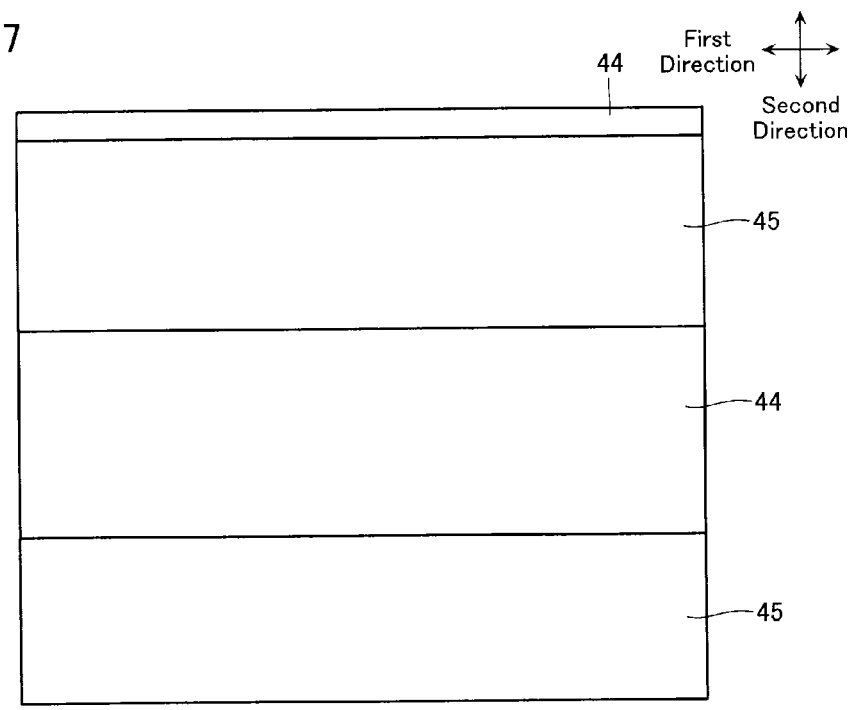
FIG. 27 is a plan view showing a manufacturing process of the same nonvolatile semiconductor memory device.
Figure 26:
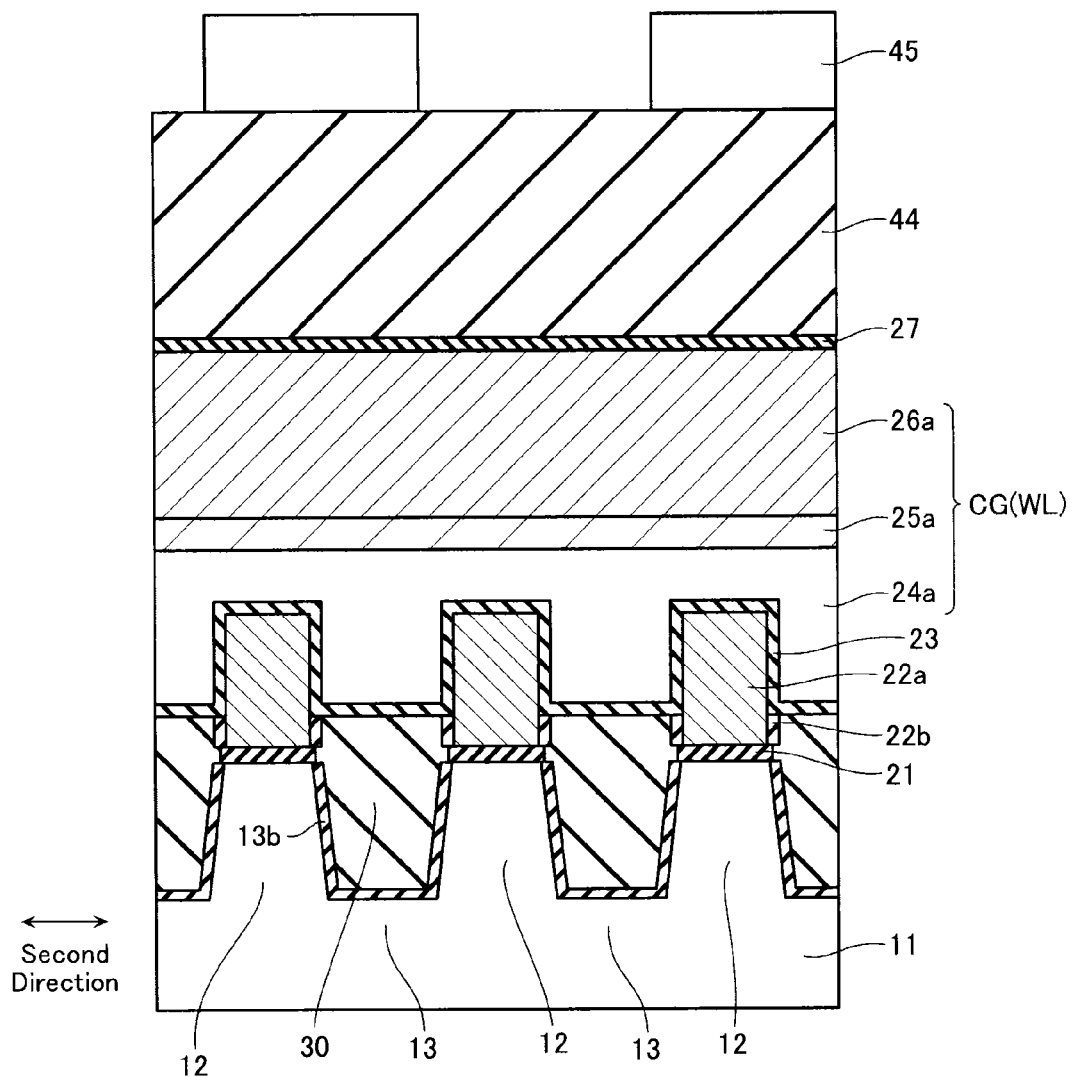
FIG. 26 is a cross-sectional view showing a manufacturing process of the same nonvolatile semiconductor memory device.

Next, as shown in FIGS. 26 and 27, a mask layer 45 extending in the first direction and divided in the second direction is formed on the collapse-prevention insulating film formation layer 44. In the present embodiment, a plurality of the mask layers 45 are formed periodically in the second direction. Note that a period with which the mask layer 45 is formed may be determined independently of a period with which the word line WL or semiconductor layer 11 is formed.

Figure 28:
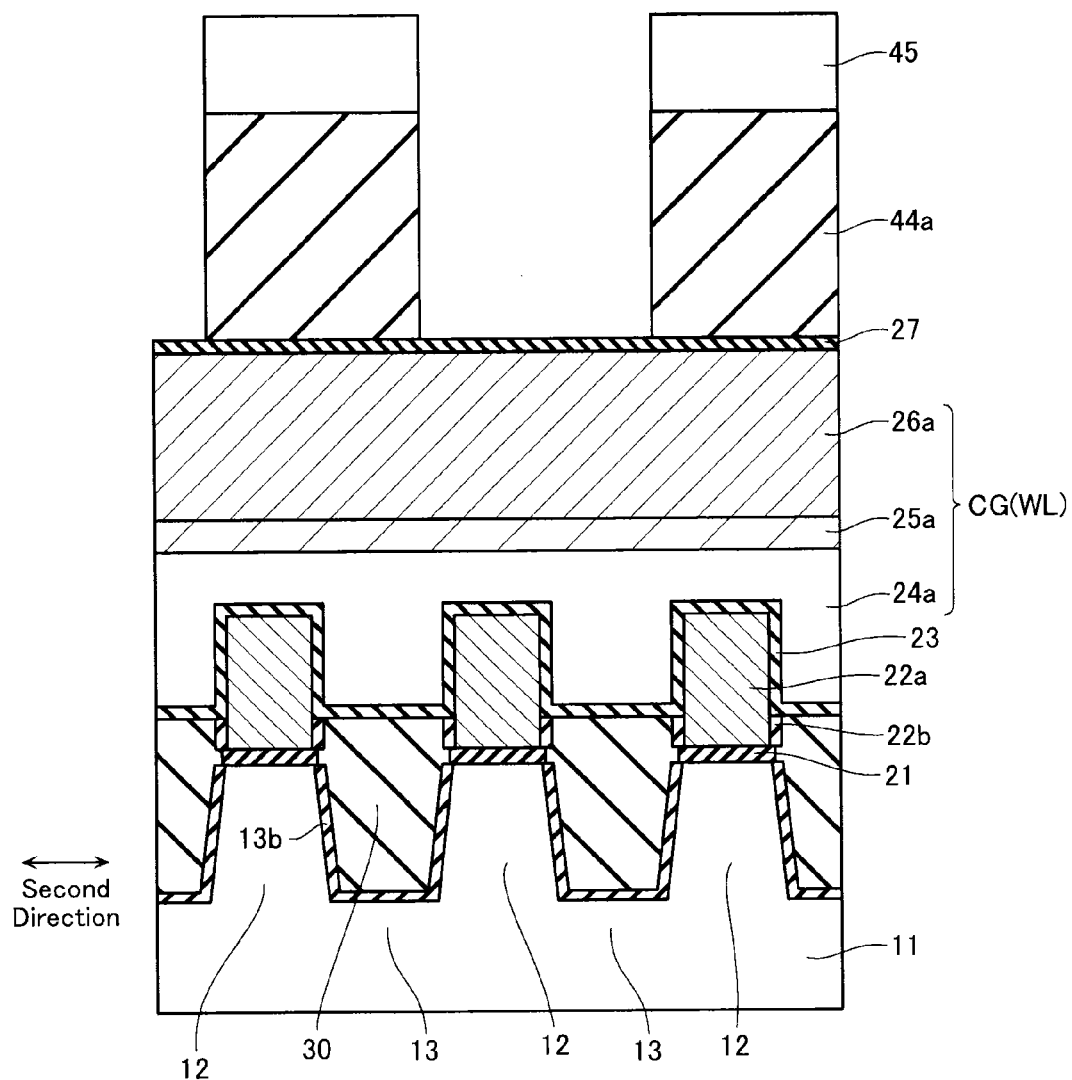
FIG. 28 is a cross-sectional view showing a manufacturing process of the same nonvolatile semiconductor memory device.
Figure 29:
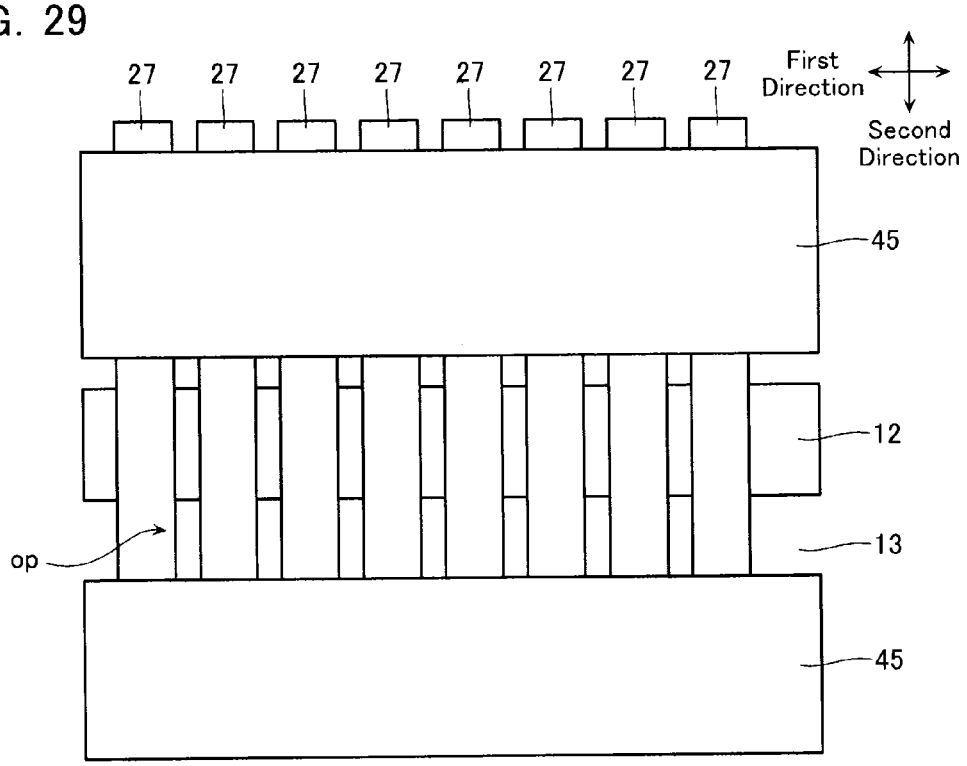
FIG. 29 is a plan view showing a manufacturing process of the same nonvolatile semiconductor memory device.

Next, as shown in FIGS. 28 and 29, etching is performed using the mask layer 45 as a mask, and part of the collapse-prevention insulating film formation layer 44 is removed to form the collapse-prevention insulating layer 44a extending in the first direction. As a result, an opening op communicating with a plurality of the gaps WAG is formed on an upper portion of the word line WL.

Figure 31:
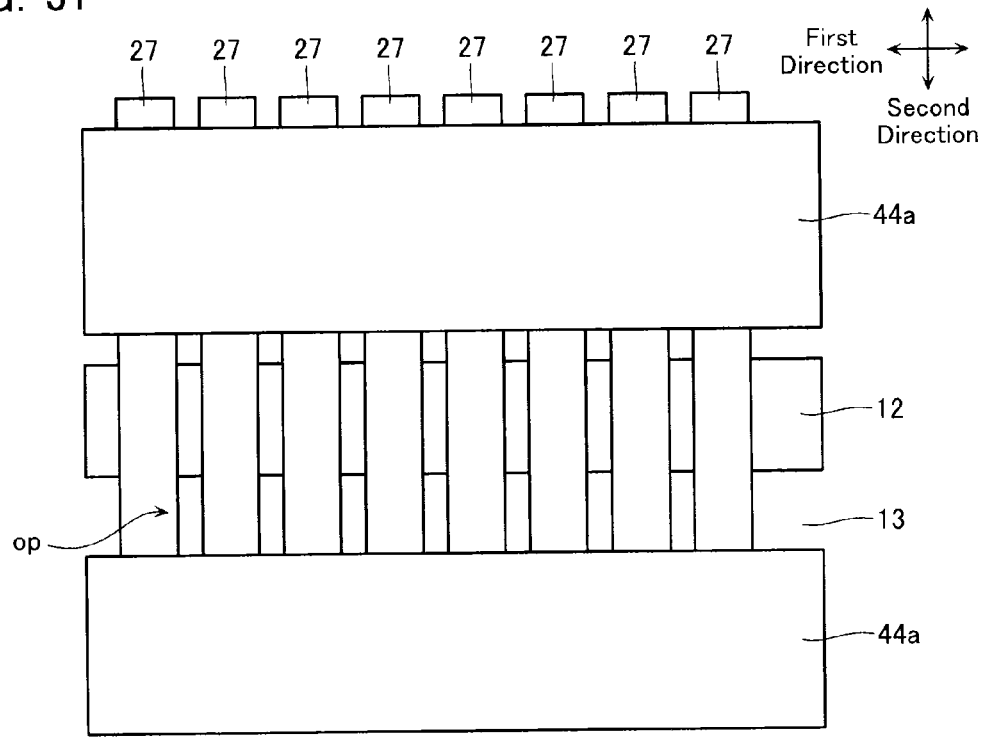
FIG. 31 is a plan view showing a manufacturing process of the same nonvolatile semiconductor memory device.
Figure 30:
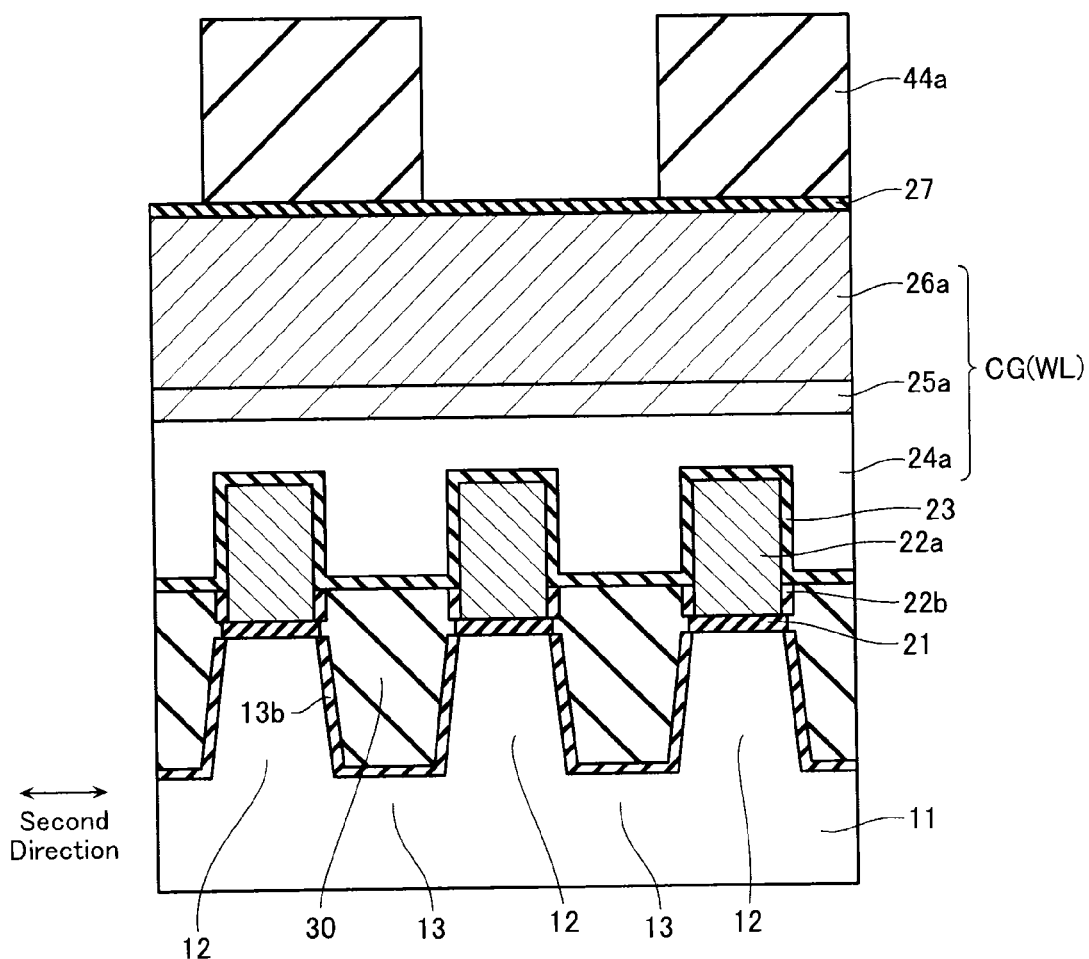
FIG. 30 is a cross-sectional view showing a manufacturing process of the same nonvolatile semiconductor memory device.

Next, as shown in FIGS. 30 and 31, the mask layer 45 is removed. Removal of the mask layer 45 is performed by, for example, an ashing method.

At this time, a cross-section along the semiconductor layer 12 has a shape such as shown in FIG. 22 or 23. Moreover, a cross-section between the word lines WL has a shape such as shown in FIG. 32. That is, schematically explaining the situation at this time, as shown in FIG. 33, the gap WAG is formed between the plurality of word lines WL, the gap WAG communicates with external via the opening op, and the residue 42 of the metallic layer 26 is deposited at a lower portion of the gap WAG.

Next, cleaning treatment is performed and the residue 42 is removed. The cleaning treatment in this process is performed by, for example, wet treatment. A chemical used in the cleaning treatment penetrates the gap WAG via the opening op. Moreover, this chemical and the residue 42 are discharged via the opening op.

Next, as shown in FIG. 34, the filler insulating film 46 that fills the opening op is formed on the upper surface of the collapse-prevention insulating layer 44a. The filler insulating film 46 is formed employing, for example, an insulating material such as plasma silane (P—SiH$_4$). Note that the portion of the filler insulating film 46 on the upper surface of the collapse-prevention insulating layer 44a is formed flatly along this upper surface. Moreover, the portion of the filler insulating film 46 between the collapse-prevention insulating layers 44a enters between the collapse-prevention insulating layers 44a. Furthermore, the height of the upper surface of the filler insulating film 46 is formed higher at the portion positioned on the upper surface of the collapse-prevention insulating layer 44a compared to at the portion positioned between these collapse-prevention insulating layers 44a. Therefore, the height of the upper surface of the upper insulating film configured from the plurality of collapse-prevention insulating layers 44a and the filler insulating film 46 changes periodically along the second direction.

Next, as shown in FIG. 35, the silicon nitride film 47 is formed on the upper surface of the upper insulating film configured from the plurality of collapse-prevention insulating layers 44a and the filler insulating film 46. The silicon nitride film 47 is formed in a knobby fashion along the upper surfaces of the plurality of collapse-prevention insulating layers 44a and the filler insulating film 46. Therefore, the height of the silicon nitride film 47 also changes periodically along the second direction.

Next, as shown in FIGS. 3 to 6, the insulating layer 48 is further formed on the upper surface of the silicon nitride film 47. As a result, the memory cell array 101 of the kind shown in FIGS. 3 to 6 is manufactured.

As shown in FIG. 33, in the method of manufacturing according to the present embodiment, the collapse-prevention insulating layer 44a and the opening op are formed on the upper portion of the plurality of word lines WL. Therefore, it is possible to clean between the plurality of word lines WL while mechanically supporting the upper portion of the word lines WL and preventing collapse of the word lines WL in the first direction. Therefore, the nonvolatile semiconductor memory device according to the present embodiment can be stably manufactured.

Moreover, in the present embodiment, removal of the residue 42 between the word lines WL is performed by wet treatment. Now, as a result of investigation by the inventors, it was found that an amount of the residue 42 per unit volume close to the tunnel insulating film (first gate insulating film 21) when cleaning is performed by wet treatment can be reduced to about 1/100 to 1/1000 compared to when cleaning is performed by dry etching. Therefore, in the present embodiment, the residue 42 between the word lines WL can be suitably removed, and the nonvolatile semiconductor memory device can be stably manufactured.

Now, when performing wet treatment between the word lines WL, surface tension sometimes acts between the word lines WL, contrary to when performing dry treatment. Now, in the present embodiment, the upper portion of the plurality of word lines WL is mechanically supported by the collapse-prevention insulating layer 44a, hence it is possible to prevent collapse of the word lines WL in the first direction due to the occurrence of surface tension.

Moreover, in order to prevent collapse of the word lines WL due to the occurrence of surface tension, it is also conceivable to perform silylation treatment that chemically covers a word line WL surface by Si and thereby reduces surface tension. However, it is sometimes difficult to prevent collapse of the word lines WL by silylation treatment when the word line WL includes a layer configured from tungsten.

In this respect, the method according to the present embodiment results in the upper portion of the plurality of word lines WL being mechanically supported by the collapse-prevention insulating layer 44a. Therefore, collapse of the word lines WL in the first direction due to the occurrence of surface tension can be prevented even when the word line WL includes a layer configured from tungsten.

[Second Embodiment]

Figure 36:
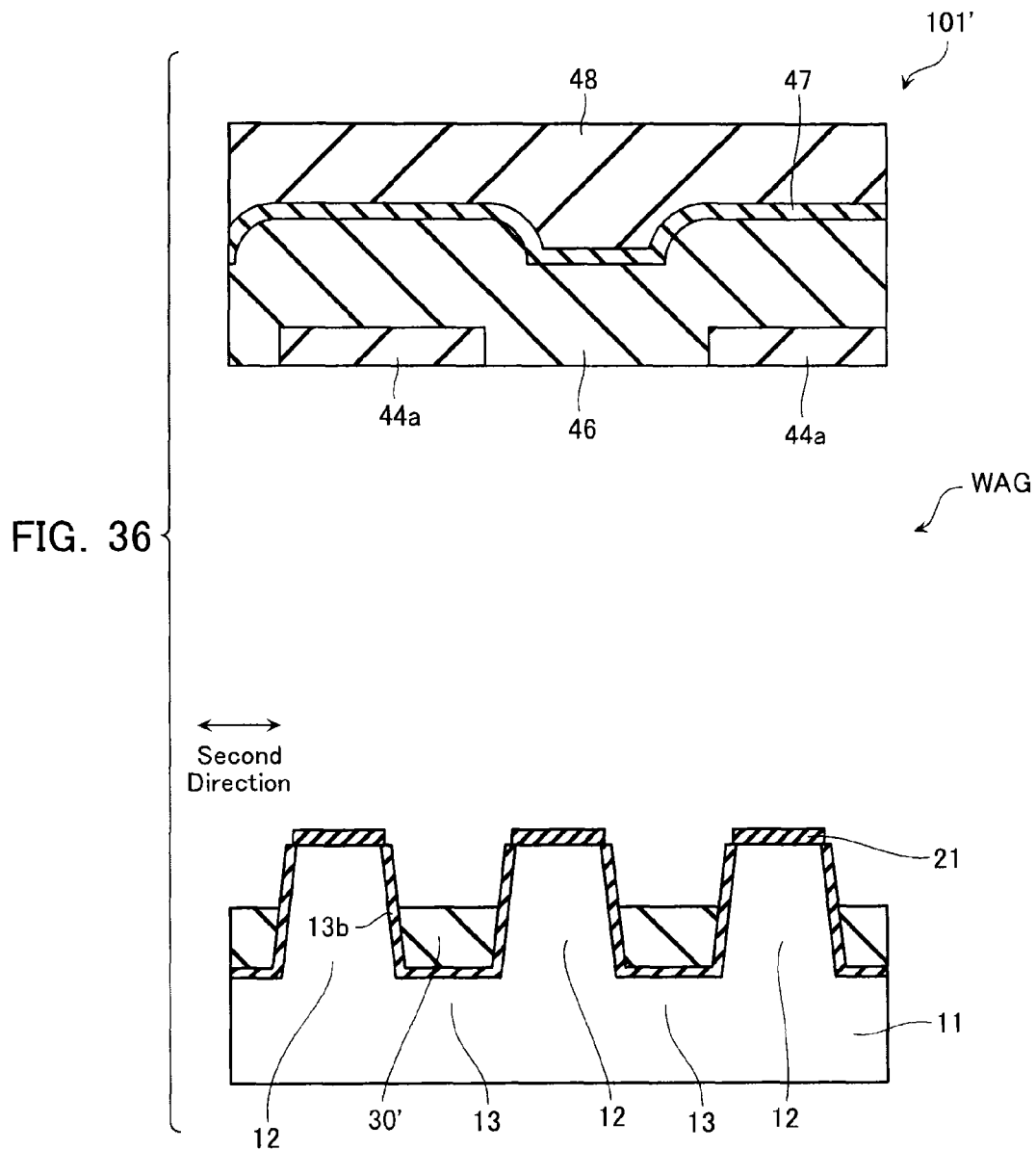
FIG. 36 is a schematic cross-sectional view showing a configuration of part of a nonvolatile semiconductor memory device according to a second embodiment.

Next, a nonvolatile semiconductor memory device according to a second embodiment and a method of manufacturing the same will be described with reference to FIG. 36. FIG. 36 shows schematically a cross-section where a memory cell array 101' according to the present embodiment is sectioned avoiding the word line WL (is sectioned between adjacent word lines WL). Note that configurations of the nonvolatile semiconductor memory device according to the present embodiment that are similar to those of the first embodiment are assigned with similar reference symbols to those assigned in the first embodiment, and descriptions thereof will be omitted.

The nonvolatile semiconductor memory device according to the present embodiment is basically configured similarly to the nonvolatile semiconductor memory device according to the first embodiment, but as shown in FIG. 36, a height of an upper surface of an element isolation insulating film 30' is lower than the height of the upper surface of the first gate insulating film 21. This makes it possible to reduce capacitive coupling of the floating gate electrodes 22a in the NAND cell unit NU and improve stability of operation of the nonvolatile semiconductor memory device.

Note that the method of manufacturing the nonvolatile semiconductor memory device according to the present embodiment is basically performed similarly to that of the first embodiment, but differs in that after the residue 42 is removed by the cleaning treatment, an upper portion of the element isolation insulating film 30 is removed. Removal of the upper portion of the element isolation insulating film 30 is performed employing, for example, dilute hydrofluoric acid. The dilute hydrofluoric acid penetrates the gap WAG via the opening op. Moreover, the dilute hydrofluoric acid and the removed upper portion of the element isolation insulating film 30 are discharged via the opening op. Then, by performing a process explained with reference to FIG. 34 and subsequent processes of the first embodiment, the memory cell array 101' according to the present embodiment is formed.

[Other Embodiments]

Figure 37:
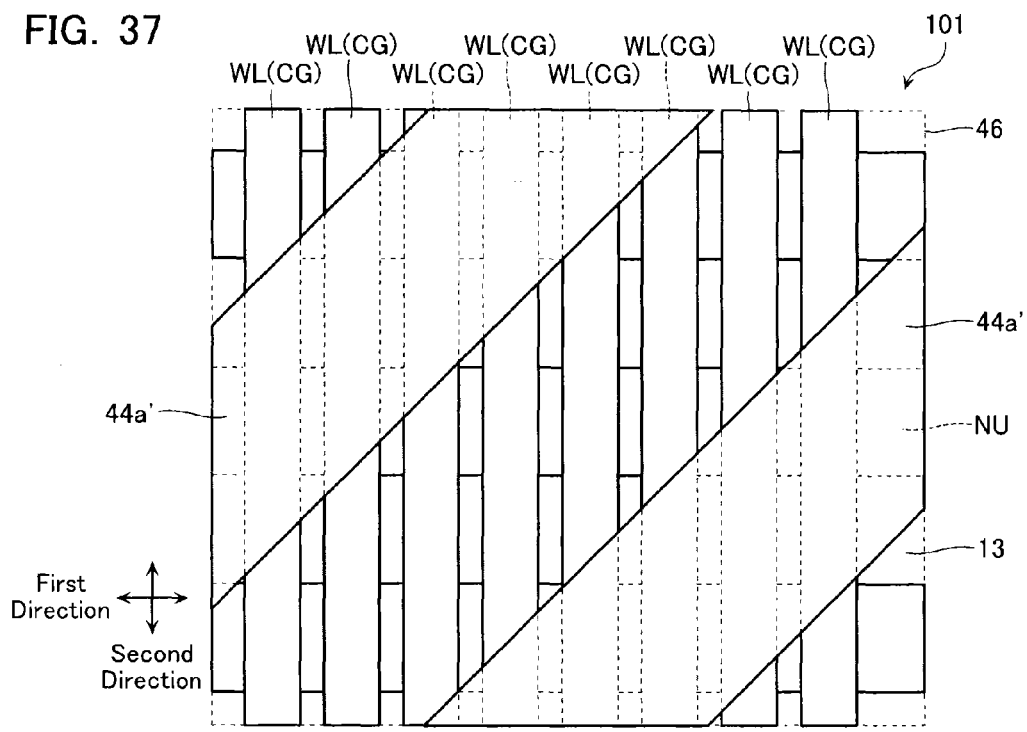
FIG. 37 is a schematic plan view showing a configuration of part of a nonvolatile semiconductor memory device according to another embodiment.
Figure 38:
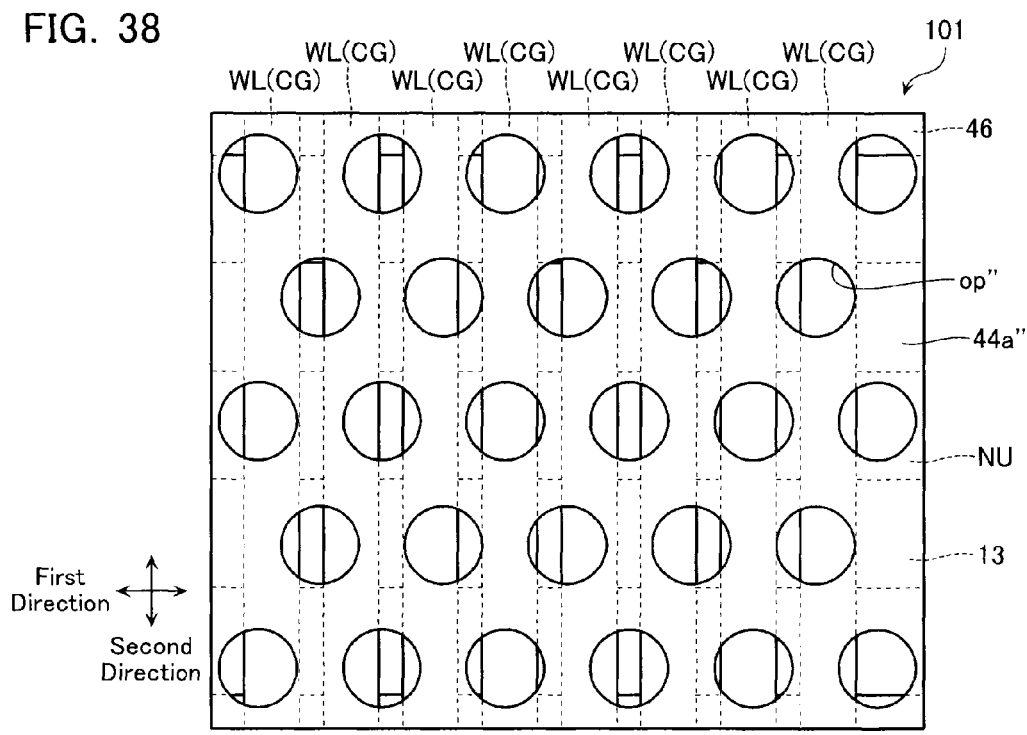
FIG. 38 is a schematic plan view showing a configuration of part of a nonvolatile semiconductor memory device according to another embodiment.
Figure 39:
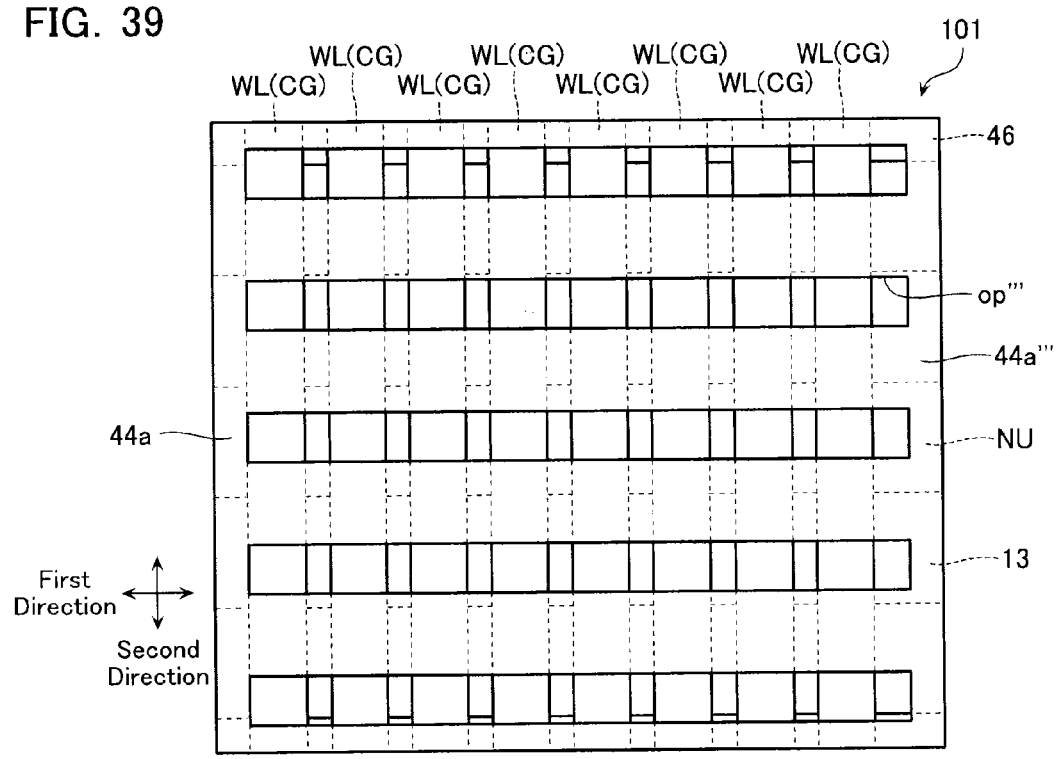
FIG. 39 is a schematic plan view showing a configuration of part of a nonvolatile semiconductor memory device according to another embodiment.

In the above-described embodiments, the collapse-prevention insulating layer 44a extended in the first direction. However, as shown in, for example, FIG. 33, it is only required that in the process for removing the residue 42, the collapse-prevention insulating layer 44a supports the upper surface of the plurality of word lines WL and that the opening communicating with the gap WAG between the plurality of word lines WL is formed. Therefore, as shown in FIG. 37, the collapse-prevention insulating layer 44a' extending in a direction between the first direction and the second direction may be formed, for example. Additionally, for example, as shown in FIG. 38, a collapse-prevention insulating layer 44a" formed in plate manner, contacting the upper surface of the plurality of the word lines WL and having a lot of openings op" communicating with the gap WAG between the plurality of word lines WL. Furthermore, as shown in FIG. 39, a collapse-prevention insulating layer 44a''' formed in plate manner, contacting the upper surface of the plurality of the word lines WL and having a lot of openings op''' extending in a direction crossing the direction of the word lines WL. In those cases, the filler insulating film 46 enters in the openings. Therefore, a height of an upper surface of the filler insulating film 46 is higher in a portion in which the collapse-prevention insulating layer if formed and lower in a portion in which the opening is formed. Note that a size or the like can be controlled in an appropriate manner.

Moreover, in the above-described embodiments, a plurality of the collapse-prevention insulating layers 44a were formed periodically in the second direction. However, it is also possible, for example, to form only one collapse-prevention insulating layers 44a or to form the plurality of collapse-prevention insulating layers 44a non-periodically.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a semiconductor layer provided on a substrate and extending in a first direction;
    a first gate insulating film formed on the semiconductor layer;
    a plurality of floating gate electrodes formed on the first gate insulating film along the semiconductor layer;
    a second gate insulating film formed on an upper surface of the floating gate electrode;
    a plurality of control gate electrodes respectively facing the upper surfaces of the plurality of floating gate electrodes via the second gate insulating film, and extending in a second direction intersecting the first direction; and
    an upper insulating film formed on an upper portion of the plurality of control gate electrodes,
    a height of an upper surface of the upper insulating film being a first height at a first position in the second direction and being a second height lower than the first height at a second position different from the first position in the second direction;
    the upper insulating film comprising:
        a plurality of first insulating layers formed in the second direction, each extending in the first direction; and
        a second insulating layer positioned on the upper surface of the plurality of the first insulating layers and between the plurality of first insulating layers,
    the first insulating layer being positioned at the first position in the second direction and a height of the upper surface of the second insulating layer being the first height at the first position, and
    a portion between the first insulating layers being positioned at the second position in the second direction and a height of the upper surface of the second insulating layer being the second height at the second position.

2. The nonvolatile semiconductor memory device according to claim 1, further comprising:
    a silicon nitride film formed on an upper portion of the upper insulating film, wherein
    a height of the silicon nitride film is a third height at the first position and a fourth height lower than the third height at the second position.

3. The nonvolatile semiconductor memory device according to claim 1, wherein
    the control gate electrode includes a layer configured from tungsten.

4. The nonvolatile semiconductor memory device according to claim 1, further comprising:
    a plurality of the semiconductor layers formed in the second direction; and
    an element isolation film formed between the plurality of semiconductor layers, wherein
    a height of an upper surface of the element isolation film is lower than a height of an upper surface of the first gate insulating film.

5. The nonvolatile semiconductor memory device according to claim 1, wherein
    the height of the upper surface of the upper insulating film is the first height at a position which is the first position in the second direction and which is between the plurality of the control electrodes in the first direction, and
    the height of the upper surface of the upper insulating film is the second height at a position which is the second position in the second direction and which is between the plurality of the control electrodes in the first direction.

* * * * *